(12) United States Patent
Smith et al.

(10) Patent No.: US 10,396,084 B1
(45) Date of Patent: Aug. 27, 2019

(54) SEMICONDUCTOR DEVICES INCLUDING SELF-ALIGNED ACTIVE REGIONS FOR PLANAR TRANSISTOR ARCHITECTURE

(71) Applicant: GLOBALFOUNDRIES Inc., Grand Cayman (KY)

(72) Inventors: Elliot John Smith, Dresden (DE); Nigel Chan, Dresden (DE); Nilesh Kenkare, Dresden (DE); Hongsik Yoon, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/944,910

(22) Filed: Apr. 4, 2018

(51) Int. Cl.
| | |
|---|---|
| *H01L 21/027* | (2006.01) |
| *H01L 27/11* | (2006.01) |
| *H01L 21/033* | (2006.01) |
| H01L 21/308 | (2006.01) |

(52) U.S. Cl.
CPC ...... *H01L 27/1116* (2013.01); *H01L 21/0337* (2013.01); *H01L 21/0338* (2013.01); *H01L 27/1108* (2013.01); *H01L 21/3085* (2013.01); *H01L 21/3086* (2013.01); *H01L 21/3088* (2013.01)

(58) Field of Classification Search
CPC ............ H01L 21/0274; H01L 21/0337; H01L 21/0338; H01L 21/3086; H01L 21/3088; H01L 21/823437
See application file for complete search history.

(56) References Cited

U.S. PATENT DOCUMENTS

| | | | |
|---|---|---|---|
| 6,875,703 B1 | 4/2005 | Furukawa et al. | |
| 7,102,181 B1 | 9/2006 | Nowak et al. | |
| 9,029,263 B1 | 5/2015 | Kim et al. | |
| 9,123,776 B2 | 9/2015 | Tsai et al. | |
| 2011/0183505 A1* | 7/2011 | Min .................. | H01L 21/0337 438/586 |
| 2014/0308761 A1 | 10/2014 | Kuo et al. | |

* cited by examiner

*Primary Examiner* — Hoai V Pham
(74) *Attorney, Agent, or Firm* — Amerson Law Firm, PLLC

(57) ABSTRACT

Active regions for planar transistor architectures may be patterned in one lateral direction, i.e., the width direction, on the basis of a single lithography process, followed by deposition and etch processes, thereby providing multiple width dimensions and multiple spaces or pitches with reduced process variability due to the avoidance of overlay errors typically associated with conventional approaches when patterning the width dimensions and spaces on the basis of a sequence of sophisticated lithography processes. Consequently, increased packing density, enhanced performance and reduced manufacturing costs may be achieved on the basis of process techniques as disclosed herein.

17 Claims, 13 Drawing Sheets

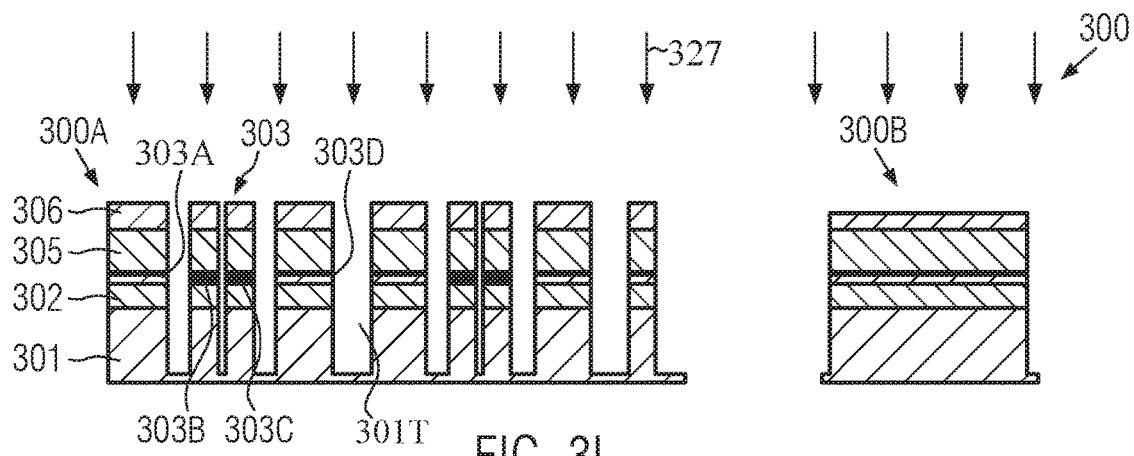
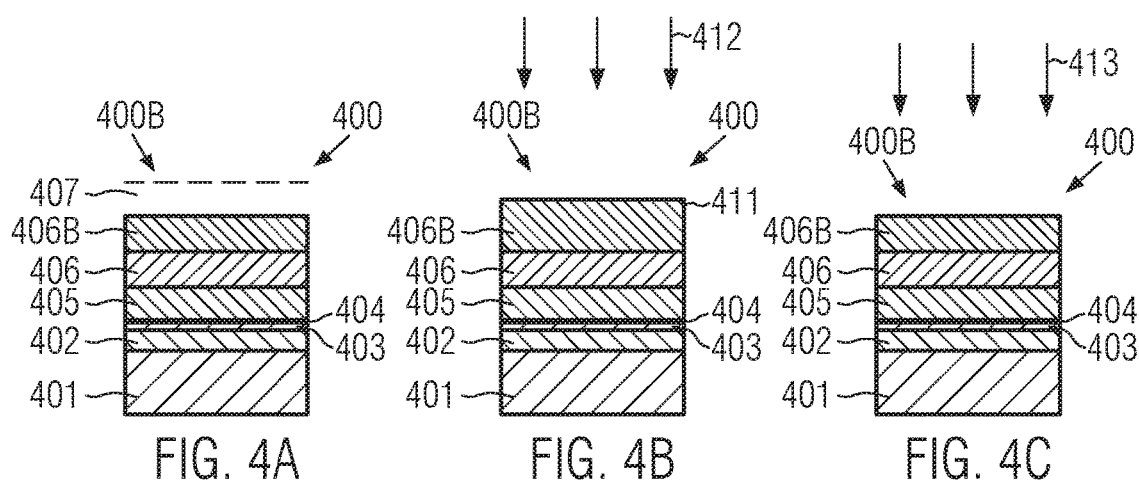
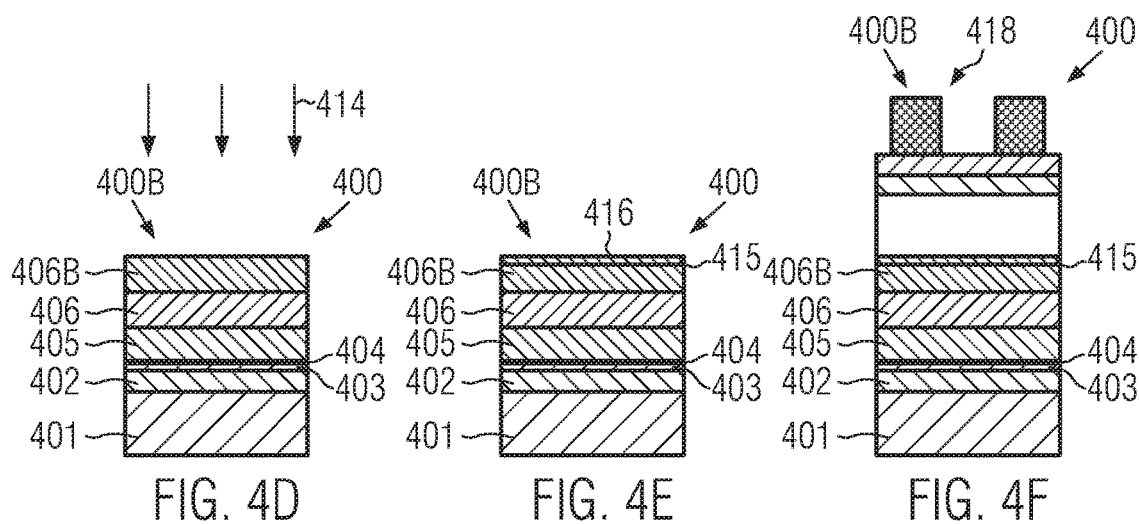

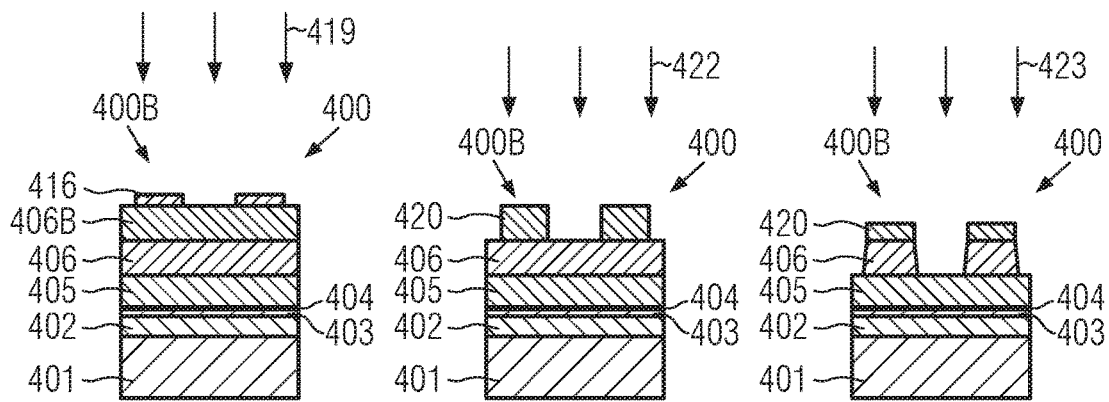
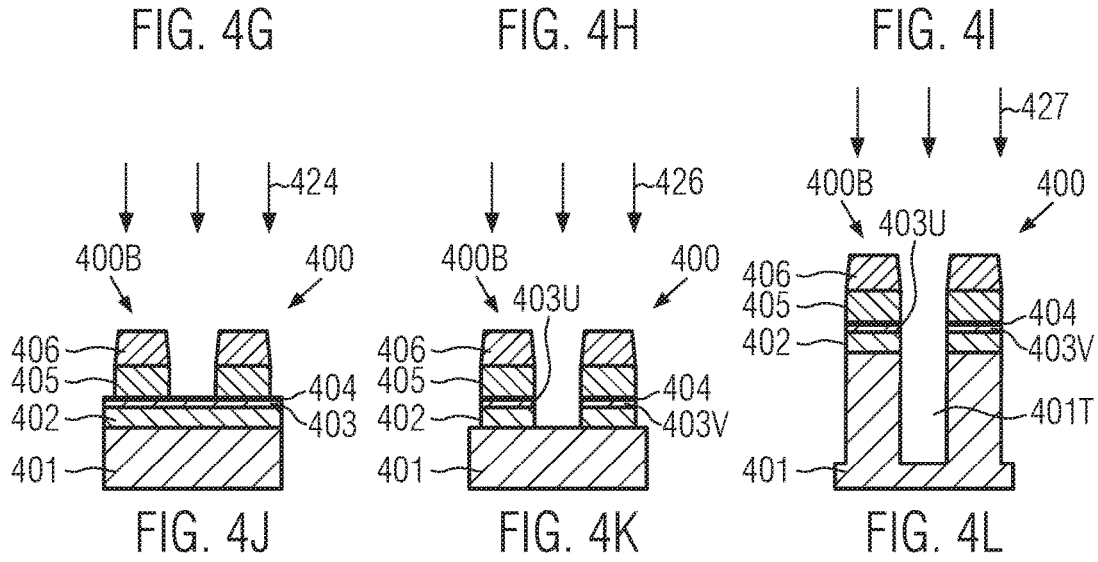
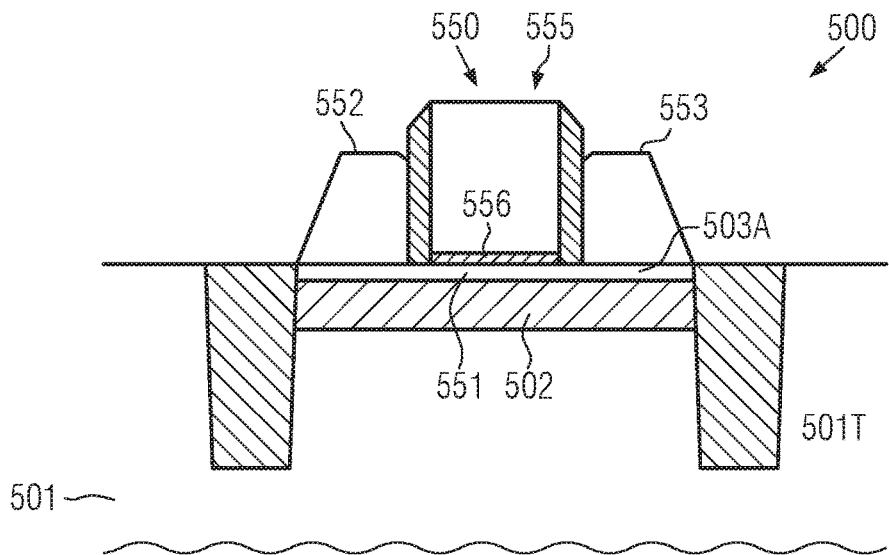
FIG. 5

SEMICONDUCTOR DEVICES INCLUDING SELF-ALIGNED ACTIVE REGIONS FOR PLANAR TRANSISTOR ARCHITECTURE

BACKGROUND

1. Field of the Disclosure

The subject matter disclosed herein relates to semiconductor devices and techniques for forming active semiconductor regions to be used for forming transistor elements based on a planar architecture.

2. Description of the Related Art

Integrated circuits are formed on the basis of a plurality of subsequent process steps in order to form tiny regions of precisely controlled size in one or more material layers of an appropriate substrate. These tiny regions of precisely controlled size are typically obtained by applying lithography, etch, implantation, deposition techniques and the like at various manufacturing stages in order to pattern the material layer or layers in accordance with the underlying device design.

The patterning of material layers formed on the substrate material may be typically accomplished by forming a type of mask layer, which may consist of or may be formed by means of a layer of resist material that is patterned by a lithography process, typically a photolithography process. To this end, the resist may be spin-coated onto the substrate surface and may then be selectively exposed to ultraviolet radiation through a corresponding lithography mask, such as a reticle, in order to image the reticle pattern into the resist layer, thereby forming a latent image therein. After developing the resist material, other mask materials and, finally, the actual device patterns may be formed by further manufacturing processes, such as etching and the like. Since the dimensions of the patterns in sophisticated semiconductor devices are continuously reduced, the finally accomplished resolution of the optical patterning process may, therefore, depend significantly on the imaging capability of the equipment used, the photoresist materials for the specified exposure wavelength, and the target-critical dimensions of the device features to be formed in the device level under consideration. For example, in current critical lithography steps, an exposure wavelength of 193 nm (ArF) may be used, wherein, in recent developments, numerical aperture and depth of focus, in particular, have been significantly improved by implementing a so-called "immersion" technique. In this immersion technique, a liquid of appropriate index of refraction is provided between the last lens of the complex optical system and the semiconductor substrate that receives the light pattern through a corresponding lithography mask.

In presently available sophisticated semiconductor devices, critical dimensions of specific device features, such as gate electrode structures of field effect transistors and active semiconductor regions, i.e., the semiconductor material in and on which respective transistor elements have to be formed, have dimensions that are significantly below the wavelength of the exposure radiation for initially forming the respective resist mask. In order to obtain the required critical dimensions, highly non-linear processes and specific measures, such as the provision of immersion liquid and the like, may have to be applied in order to arrive at the required target dimensions well below the optical resolution. For example, extremely non-linear photoresist materials may be used in which a desired photochemical reaction may be initiated on the basis of a well-defined threshold so that weakly exposed areas may not change at all, while areas having exceeded the threshold may exhibit a significant variation in the chemical stability with respect to a subsequent development process.

Furthermore, additional process techniques may be applied, which may enable a further reduction of the resist features, thereby providing the capability of further reducing the critical dimensions of circuit elements. For example, appropriate hard mask features may be formed on the basis of sophisticated etch and deposition techniques, thereby enabling the patterning of gate electrode structures, active regions and the like, with critical dimensions that substantially correspond to the previously adjusted dimensions of the mask features.

In recent developments, various approaches have been taken in order to design highly complex integrated circuits with critical dimensions of 30 nm and significantly less, wherein, on the one hand, three-dimensional transistor architectures are implemented, thereby requiring highly complex manufacturing strategies. In other approaches, transistor performance has been significantly improved on the basis of well-established planar transistor architectures, for instance, by employing fully depleted semiconductor regions, above which highly complex, yet well-established electrode structures may be formed.

In this context, a planar transistor architecture is to be understood as an architecture in which a channel region, i.e., the region in which current flow between a source region and a drain region of a field effect transistor is controlled based on an electric field applied via a gate electrode, has a substantially planar geometry, i.e., the current flow takes place in the vicinity of a single surface area without providing a plurality of angled surface areas for current flow, as is the case in three-dimensional transistor architectures. A fully depleted configuration in at least a portion of a channel region of a planar transistor element may be basically accomplished by using a very thin semiconductor material, such as a crystalline silicon material, a crystalline silicon/germanium material and the like, with an initial thickness of approximately 15 nm and significantly less, thereby achieving high performance while still avoiding a plurality of manufacturing challenges typically associated with the formation of three-dimensional transistor architectures.

When forming sophisticated transistor elements based on planar device architecture, the respective thin basic semiconductor material has to be laterally patterned, i.e., respective isolation trenches may have to be formed, which may have different depth and dimensions depending on the overall design criteria. In particular, in densely packed device areas, such as static RAM (random access memory) areas in complex semiconductor devices, the task of providing active regions with appropriate lateral size and shape is an extremely challenging process phase, since, in this case, extremely reduced critical dimensions may also have to be implemented in order to improve device performance, for instance, in terms of overall packing density. For example, the total area of a RAM cell may have a significant influence on overall packing density, since extended RAM areas may be required for many types of complex control circuitry. Typically, different types of transistor elements may have to be provided in a typical RAM cell design, such as pull-up transistors, pull-down transistors, pass gate transistors, which may require different characteristics with respect to their current-carrying capacity, so that, in view of increasing overall packing density, the different current-carrying capacities may be accomplished by providing different transistor width dimensions for an otherwise relatively similar transistor configuration. As a consequence, in densely packed device areas the respective active regions may have to be provided in critical device areas with precisely defined size and shape in order to ensure proper functionality at a desired high packing density.

In currently available techniques, the active regions of sophisticated transistor elements having a planar architecture may be obtained on the basis of a complex process sequence, including repeatedly applied lithography-etch sequences (LELE . . . ) based on highly sophisticated immersion-based lithography techniques. That is, a sequence of sophisticated lithography steps followed by etch steps may be required for, firstly, defining respective deeper trenches for delineating active regions along a certain lateral direction, followed by further lithography and etch sequences for defining further active region boundaries along the specific lateral direction, followed by an additional sophisticated lithography and etch sequence for forming an isolation trench in the orthogonal lateral direction. Consequently, a relatively large number of sophisticated lithography processes may contribute to significant overall manufacturing costs.

Moreover, in view of device performance, the various highly critical lithography processes may have to be aligned with respect to each other, thereby necessarily introducing certain variability due to unavoidable overlay errors determined by the overlay capabilities of the respective lithography processes. Further variability is also introduced due to mask-to-mask, chamber-to-chamber and stepper-to-stepper offsets, all of which are very critical given that at least two LE processes are used to define a single cell. This leads to a potentially dramatic variability within single cell patterning. A corresponding process strategy to form critical device areas, such as static RAM areas, in which multiple width and pitches of active regions may have to be implemented due to respective design requirements as discussed above, may, therefore, result in reduced flexibility with respect to further scalability of respective designs, since lithography-based variations in width and pitch may have to be accounted for by the basic device design.

In view of the situation described above, the present disclosure relates to semiconductor devices and manufacturing techniques in which sophisticated patterning regimes may be applied for forming active regions for sophisticated planar transistor elements, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that different dimensions in one lateral direction of active semiconductor regions and different pitches, i.e., the sum of width and space along the specified lateral direction, may be accomplished on the basis of a single critical lithography process in which one or more basic widths and pitches may be set for a resist mask pattern, while actual device specific width dimensions and pitches may be accomplished by applying deposition and etch techniques based on the resist mask features obtained by the previously performed lithography process. Thus, effectively, many device variations typically associated with overlay imperfections and lithography-associated variations may be "replaced" by deposition-related variations, wherein extremely well-controllable deposition recipes are available in which a highly conformal deposition behavior with well-controllable layer thickness may be implemented, such as ALD (atomic layer deposition) techniques, thereby achieving superior control of process variations compared to lithography and overlay processes. Moreover, since the final number, width and spaces or spacings, and thus, pitches of the respective active semiconductor regions may be defined on the basis of deposition and etch techniques based on a resist structure and a respective hard mask previously formed in a single lithography process, a "self-aligned" arrangement of a plurality of active regions of different widths and spaces may be obtained, thereby contributing even further to superior performance and flexibility in further scaling of the respective device design.

One illustrative embodiment disclosed herein relates to a method including forming a first plurality of first mask features from a sacrificial material layer formed above a semiconductor layer of a semiconductor device, wherein the first plurality of first mask features has one or more first lateral spacings of a first value along a width direction and wherein the one or more first lateral spacings are defined by a lithography process. The method further includes forming a second plurality of second mask features associated with the first mask features by forming a mask material directly adjacent to the first plurality of first mask features, wherein the second plurality of second mask features has one or more second lateral spacings of a second value, with the second value being less than the first value. Furthermore, the method includes modifying at least one of the one or more second lateral spacings of the second plurality of second mask features by forming a spacer material directly adjacent to and between associated second mask features. Additionally, the method includes forming a plurality of active regions from the semiconductor layer by using the second plurality of second mask features including the modified at least one second lateral spacing, wherein each of the plurality of active regions represents a semiconductor base layer for forming a planar field effect transistor.

According to a still further illustrative embodiment disclosed herein, a method relates to forming active regions in a semiconductor device. The method includes forming a plurality of first mask features with width dimensions and respective lateral pitches obtained by a first lithography process. The method further includes forming a plurality of second mask features from the plurality of first mask features by applying a sequence comprising at least one first deposition process, a subsequent etch process and at least one further deposition process. Furthermore, the method includes separating a plurality of active regions along a width direction by etching through a semiconductor layer using the plurality of second mask features as an etch mask. Additionally, the method includes separating the plurality of active regions along a length direction on the basis of a second lithography process.

A further illustrative embodiment disclosed herein relates to a semiconductor device. The semiconductor device includes a device region comprising a plurality of active regions having formed thereon transistor elements of planar architecture, wherein a smallest pitch of the plurality of active regions along a width direction of the transistor element is 70 nm or less.

BRIEF DESCRIPTION OF THE DRAWINGS

The disclosure may be understood by reference to the following description taken in conjunction with the accompanying drawings, in which like reference numerals identify like elements, and in which:

FIGS. 3A-3L schematically illustrate cross-sectional views of the semiconductor device during various manufacturing stages in implementing the concept as illustrated in FIG. 1B according to illustrative embodiments;

FIGS. 4A-4L schematically illustrate cross-sectional views of the semiconductor device according to various manufacturing stages with respect to a device region including transistor elements of a critical signal path obtained in correlation with the process sequences described with reference to FIGS. 2A-2O and 3A-3L according to illustrative embodiments; and FIG. 5 schematically illustrates a cross-sectional view along a line indicated by numeral V of FIG. 1A, illustrating a field effect transistor formed on the basis of a planar transistor architecture according to illustrative embodiments.

Figure 1A:
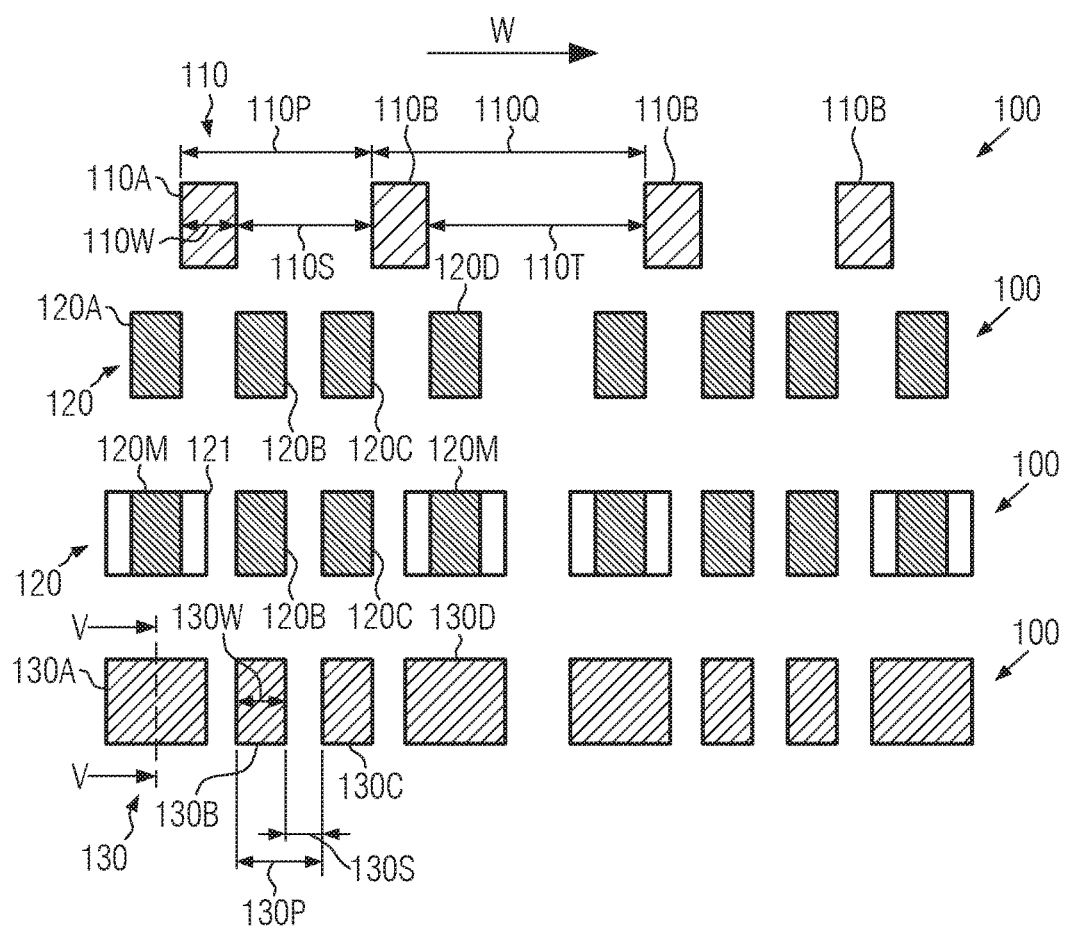
FIG. 1A schematically illustrates a cross-section of a semiconductor device in a very simplified manner during various manufacturing stages, beginning with mask features defined by lithography and further mask features obtained by a deposition and etch sequence, followed by mask features having a modified width dimension according to the principles of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure generally provides manufacturing techniques and respective semiconductor devices in which the number of critical lithography steps may be reduced for forming critical device portions, in illustrative embodiments as active regions for planar transistor elements, by "replacing" at least one critical lithography process by deposition and etch techniques. It has been recognized that, in particular, the spatial relationship in one lateral direction, for instance, the width direction of future planar transistor elements, may be accomplished on the basis of a reduced number of critical lithography steps, for instance, in some illustrative embodiments, by using one critical lithography step in which initial width dimensions and spaces may be defined. Thereafter, the final number of required device components, their width dimensions and spaces may be accomplished in a self-aligned manner by applying deposition and etch techniques to the previously established mask features that have been obtained by a single lithography process. The self-aligned nature of the finally obtained device features, such as respective active semiconductor regions, may be accomplished by using the mask features initially defined by a single lithography process as a base structure, the topography of which may subsequently be taken advantage of and modified by deposition and etch techniques, wherein, in particular, the highly controllable process parameters of sophisticated deposition techniques may, thus, provide for reduced overall device variability compared to any device variations caused by overlay techniques, during which pattern features of different lithography processes may have to be aligned with each other. Consequently, on the basis of an initial single lithography process, different width dimensions of and spaces or spacings between neighboring active regions may be accomplished below the resolution limit of the initial lithography step, irrespective of the technique used in the lithography process. In some illustrative embodiments, the initial lithography process may be applied in the form of an immersion ArF lithography process, while, in other illustrative embodiments, even a less critical non-immersion lithography process may be applied in obtaining the initial mask features.

Due to the high degree of accuracy and controllability of deposition processes in combination with well-established etch techniques, the concepts disclosed herein provide for superior flexibility and scalability of present semiconductor designs, since, generally, the lateral dimensions may be reduced, in particular, in densely packed device areas, such as RAM areas, while, on the other hand, the design of the transistor elements or of the entire RAM cell may no longer have to accommodate respective lithography-induced variations of individual transistors in order to ensure proper functionality of, for instance, a RAM cell.

For example, in presently available sophisticated semiconductor devices formed on the basis of planar transistor architecture, a pitch, i.e., width+space, of approximately 78 nm may be achievable for active regions by conventionally applied lithography-based techniques in which several highly critical immersion-based lithography processes may have to be implemented. Without changing the basic cell design, the concepts as disclosed herein may provide the potential of significantly reducing these values with the prospect of even further scalability of the overall cell dimensions, while, on the other hand, even reducing the number of cost intensive lithography processes. Consequently, the ratio of the total width of the active regions to the total width of isolation regions within a single RAM cell may be significantly reduced compared to conventional strategies, thereby obtaining a significantly higher packing density.

FIG. 1A schematically illustrates a simplified cross-sectional view of a semiconductor device 100, i.e., the most relevant part thereof for the process sequence of interest, wherein, for convenience, a portion thereof may be shown so as to illustrate the spatial relationship in a densely packed device area. In Illustrative embodiments, the portion of the semiconductor device 100 illustrated in FIG. 1A may represent a static RAM area. As illustrated, in an initial stage, a plurality of mask features 110 may be provided in the form of hard mask features, which may have specific lateral dimensions along a first lateral direction, indicated as W and also referred to herein as a width direction. It should be appreciated that the dimensions of the plurality of first mask features 110 in the orthogonal lateral direction, i.e., in FIG. 1A the direction perpendicular to the drawing plane, is to be understood as the length dimension, along which each of the mask features 110 may extend a significant length, thereby forming respective elongated stripes.

As illustrated, the plurality of first mask features 110, which may be formed of any appropriate sacrificial material, such as polycrystalline silicon, amorphous silicon and the like, as will be discussed later on, may be positioned and formed on the basis of a lithography process having the capability of appropriately providing the first mask features 110 with a desired width 110W and with appropriate spaces 110S, 110T with respect to a laterally adjacent mask feature.

Consequently, when considering the spatial relationship of the plurality of mask features 110 along the width direction W, respective pitches 110P, 110Q, i.e., the sum of width 110W+spacing 110S or 110T, may have to be provided during a corresponding process sequence for forming the mask features 110 on the basis of a lithography process. For example, in some illustrative embodiments, the respective lithography process may be performed on the basis of well-established ArF lithography techniques using the immersion approach, while, in other illustrative embodiments, the initially selected pitches 110P, 110Q may be within the capabilities of sophisticated lithography techniques without having to implement an immersion approach. That is, in some illustrative embodiments, the initial sacrificial mask features 110 may be provided on the basis of a non-immersion ArF lithography process.

In the embodiment shown in the uppermost area of FIG. 1A, the mask features 110 may be formed on the basis of a single width 110W, which may be selected to any appropriate value. For illustrative purposes and in sophisticated applications, a design width of approximately 50 nm may be selected. It should be appreciated, however, that, depending on the overall device criteria, any other width may be selected as appropriate. Similarly, the spacing 110S may be selected on the basis of any appropriate design value, in this example 100 nm, while other values may be selected in accordance with overall criteria. Consequently, the pitch 110P may correspond to 150 nm. Similarly, the space 110T may be provided on the basis of a design value of 170 nm, thereby obtaining the pitch 110Q having a value of 220 nm. For the pitch 110Q, also the same criteria apply as previously discussed and, thus, this design value may be selected in accordance with overall device requirements. It is to be noted that less critical design values may be selected so as to significantly relax complexity of the related lithography process.

FIG. 1A schematically illustrates a second phase of the overall process flow in which a second plurality of mask features 120 may be provided, which may be accomplished by applying deposition and etch techniques, as will be discussed later on in more detail. The second mask features 120 may, thus, include a plurality of individual feature elements 120A-120D for one RAM cell, while the same features may be provided for a laterally adjacent RAM cell. It should be appreciated that the previously provided first mask features 110A may have been removed upon forming the second mask features 120, as will be explained later on in more detail.

Basically, the plurality of second mask features 120 may be considered as "sidewall spacers" of the mask features 110, obtained by selectively removing the mask features 110 from the semiconductor device 100. Consequently, the number of mask features 120 may be greater than the number of mask features 110, since, typically, two second mask features 120 may be obtained on the basis of one mask feature 110.

In a next process phase as shown in FIG. 1A, the plurality of mask features 120 may undergo a "modification" process for a part thereof in order to obtain, in total, the desired different width and space dimension along the width direction W for any of the second mask features 120. The modification of the width and, thus, spacing of at least some of the mask features 120 formed in the previous process phase may also be accomplished on the basis of at least one deposition process in combination with a non-critical lithography process and an etch process in order to form "sidewall spacers" 121 and thus respective modified mask elements, such as 120M, which may correspond to transistor elements requiring an increased current-carrying capacity. It should be appreciated that a respective etch process may also represent a part of an etch sequence for etching into any underlying material layers, so as to finally laterally delineate respective active regions.

The bottom part of FIG. 1A illustrates a further advanced process phase in which the previously provided modified mask features 120 may have been used as an etch mask and may have been removed in order to provide respective active regions 130, for instance, including active regions 130A, 130D designed for transistor elements of increased current-carrying capacity, in combination with active regions 130B, 130C designed for transistor elements requiring a reduced current-carrying capacity. For example, the active regions 130A, 130D may be used for forming therein planar pass gate or pull-down transistors, while the active regions 130B, 130C may be used for forming therein planar transistor elements used as pull-up transistors of a RAM cell.

Consequently, the plurality of active regions 130 may be provided with appropriate width 130W and space 130S, thereby obtaining a desired pitch 130P. For convenience, a smallest pitch is illustrated as pitch 130P, i.e., the width 130W and the space 130S may represent a smallest pitch which is to be implemented in the semiconductor device 100 or at least in a specific device area thereof, for instance, in a RAM cell. For example, as discussed above, in sophisticated currently available semiconductor devices based on planar transistor architecture, a smallest pitch implemented in RAM cells may be approximately 78 nm, while according to the concept as discussed with reference to FIG. 1A, the pitch 130P may be significantly less and may be approximately 50 nm and even less, depending on the required device characteristics. Consequently, the "fill factor" of the RAM cell in the form of the percentage of the active regions to isolation regions, i.e., the percentage of the total width of the active regions 130 to the total width dimension, i.e., width dimensions+spaces, may be increased from approximately 63.2% in sophisticated currently available RAM cells to a percentage of approximately 65% and even higher for given width dimensions for the individual active regions 130. This may be achieved by correspondingly reducing the spaces, such as the space 130S, which may be reduced to any value dictated by electric field distribution and the like. For example, the space 130S may be reduced to approximately 15 nm and even less, such as approximately 10 nm in sophisticated applications.

It should be appreciated that the concept as described with reference to FIG. 1A may be readily applied to any other device areas in which a plurality of differently dimensioned device features, such as active regions, may be required. In particular, as will be discussed later on in more detail, the concept as discussed with reference to FIG. 1A and later on with reference to FIG. 1B may be compatible with the fabrication of transistor elements requiring reduced switching speed and high current-carrying capacity, for instance, transistors for time critical signal paths in logic circuit portions and the like.

Figure 1B:
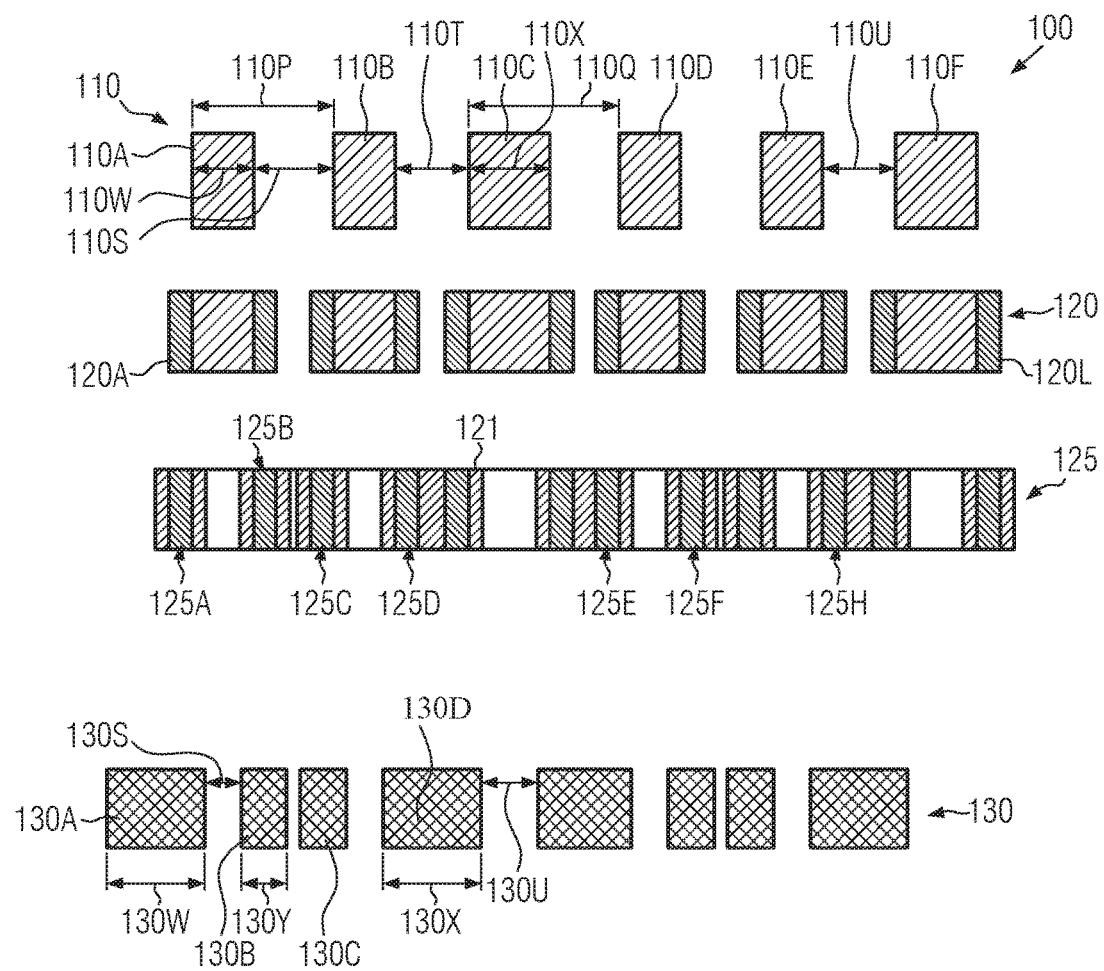
FIG. 1B schematically illustrates a cross-section of a semiconductor device in a very simplified manner in order to illustrate the concept of FIG. 1A according to a modified variant, wherein one or more additional dummy features may be obtained during the initial width-and-space-defining lithography process.

FIG. 1B schematically illustrates a highly simplified cross-sectional view of the semiconductor device 100 according to further illustrative embodiments, wherein, similar to the representation of FIG. 1A, different process phases are illustrated, beginning with the providing of the first plurality of the first mask features 110 based on a single critical lithography process, followed by providing a second plurality of mask features based on deposition and etch techniques in order to obtain the finally required pattern of active regions having specified width dimensions and spaces.

As illustrated, the mask features 110 may include a plurality of individual mask features 110A-110F as may be required for two laterally adjacent RAM cells or any other space-critical device area. Compared to the concept as described in FIG. 1A, an additional sacrificial mask feature may be provided per future RAM cell, such as the mask features 110C and 110F. It should be appreciated, however, that any number of additional mask features may be provided, as long as the lateral dimension and spacing of the resulting pattern are well within the capabilities of the basic lithography technique used to provide the plurality of first mask features 110.

In the embodiment shown, two or more width dimensions may be implemented, such as the width 110W for the mask features 110A, 110B and 110D, 110E, as an illustrative value of approximately 50 nm, are shown in the figure for a sophisticated RAM cell, while a second different width dimension 110X, such as 70 nm, may be provided for the mask features 110C, 110F. As also discussed above, it should be noted that these design values are representative values only, and may be selected in accordance with overall device requirements. Similarly, different dimensions for the respective spaces between laterally adjacent mask features 110 may be provided, for instance, the spacing 110S between the mask features 110A, 110B, may be 70 nm for the above-indicated sophisticated illustrative example, and similarly for the adjacent RAM cell between the mask features 110D and 110E. A spacing 110T, in the example shown 70 or 60 nm, may be provided for the mask features 110B, 110C, while a slightly different spacing 110U, for this example 55 nm, may be selected for the mask features 110E, 110F, for instance, when slightly different transistor width dimensions for respective active regions may be required for a portion of a respective active region corresponding to a pass gate transistor and a pull-down transistor, respectively. It should be appreciated, however, that any appropriate design values may be selected in the context of the present disclosure.

Consequently, as is evident from FIG. 1B for the specific embodiment illustrated therein, two or more different pitches, such as the pitches 110P, 110Q, may be provided for obtaining the first mask features 110 having the respective different width dimensions and spaces, as discussed above. Again, the respective pitches 110P, 110Q of FIG. 1B may be selected so as to be well within the capabilities of a respective lithography process, as discussed above and also the same criteria explained above with reference to FIG. 1A may also apply in this case.

In a next process phase, the plurality of second mask features 120 may be formed on the basis of deposition and etch techniques, as already discussed above, thereby obtaining the respective number of second mask features or sidewall spacers 120A-120L formed on the first plurality of mask features 110. For convenience, in this illustration, the first mask features 110 are still present and will be subsequently removed on the basis of well-established etch techniques.

The next phase illustrates the second plurality of mask features, after the removal of the first mask features 110, in a modified form indicated as mask features 125, the width of which may be appropriately adjusted on the basis of an additional deposition process, possibly in combination with a non-critical lithography step for masking specific ones of the mask features 125. That is, during this deposition and etch sequence, respective "sidewall spacers" 121 may be formed with appropriate width so as to define a total width and respective spaces for the mask features 125. For example, the width of the sidewall spacers 121 may result in a desired width of the mask features 125B and 125C with a desired small space therebetween. On the other hand, the deposition of the material for the spacers 121 may result in a desired increased total width of the mask features 125D, 125E and 125H, since, upon forming the spacers 121, no space may be obtained between the relevant previous mask features 120 and the newly formed spacers 121. Consequently, a plurality of small width dimensions, such as for the mask features 125B, 125C, 125F and the like, with small pitches may be established, while other mask features may have an increased width, such as mask features 125D, 125E, 125H.

The bottom section of FIG. 1B Illustrates the finally obtained pattern of active regions 130 that may be formed on the basis of a patterning process using the mask features 125 as an etch mask. As is evident, the active regions 130 may represent active regions of portions of two adjacent RAM cells, including, for instance, the active regions 130A, 130B, 130C, 130D, representing design values of respective width dimensions, such as 130W and 130X, which may be appropriate for a pass gate transistor and a pull-down transistor, respectively, of similar width dimension, which may, however, slightly differ. For example, the design value of the active region 130A may be approximately 75 nm, while the respective pass gate portion of the active region 130D may have a design value of approximately 80 nm.

Moreover, the active regions 130B, 130C may have appropriate width dimensions so as to comply with the requirements of a pull-up transistor, for instance 40 nm. Furthermore, respective spaces, such as 130S and 130U may be obtained so as to provide for superior packing density. Also in this case, a minimal pitch may correspond to the sum of the width dimension 130Y and the spacing 130S, which may be significantly less compared to the respective smallest pitch of conventionally available RAM cells. In the example shown, the smallest pitch may be approximately 50 nm. It is to be noted, however, that these values may readily be adapted to the basic device design by appropriately selecting the initial design values of the resist mask features 110 and the parameters of the subsequent deposition processes, i.e., the respective implemented layer thickness values, during the further processing.

With reference to FIGS. 2A-2O, 3A-3L, 4A-4L and 5, further illustrative embodiments will now be described in more detail, wherein reference may also be made to FIGS. 1A and 1B, if appropriate.

Figure 2A:
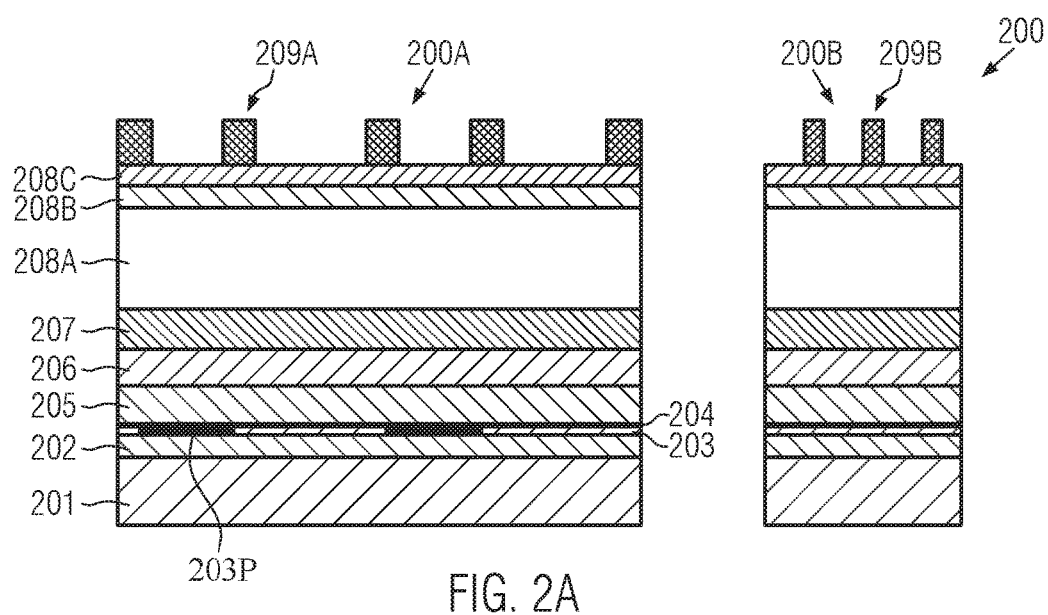
FIGS. 2A-2M schematically illustrate cross-sectional views of the semiconductor device during various manufacturing stages in implementing the concept as shown in FIG. 1A according to illustrative embodiments.

FIG. 2A schematically illustrates a cross-sectional view of a semiconductor device 200 in an early manufacturing stage. The semiconductor device 200 may include a first device region 200A and a second device region 200B, wherein the first device region 200A may represent, in one illustrative embodiment, a memory area, such as a static RAM area, in which a plurality of memory cells, for instance, based on a 6-transistor logic, may have to be implemented. On the other hand, the second device region 200B may represent an area in which sophisticated transistor elements may have to be formed with high switching speed and appropriate current-carrying capacity, as may be typically required in time-critical signal paths, such as in a logic circuit portion.

The semiconductor device 200 in this manufacturing stage may include a substrate 201, such as a crystalline silicon material formed on any appropriate carrier material or representing the carrier material, while, in other cases, any other appropriate materials, such as silicon/germanium, silicon/carbon, carbon, germanium and the like, may be used. Moreover, an upper portion of the substrate material 201 may represent an appropriate semiconductor layer 203, in and above which respective circuit elements, such as field effect transistors, may be formed. To this end, the semiconductor layer 203 may have an appropriate material composition and thickness in compliance with device requirements. For example, the base semiconductor material of the layer 203 may be frequently modified in some areas, for instance in areas corresponding to the active regions of transistors of different conductivity type and the like. For example, respective modified portions 203P may be provided in a spatially appropriate manner within the semiconductor layer 203. For example, the modified portions 203P may represent semiconductor material including a crystalline silicon/germanium material, which may provide for superior performance of P-type transistor elements. In some illustrative embodiments, the semiconductor layer 203 may have an initial thickness of 15 nm and even less, thereby enabling the formation of fully depleted areas in respective channel regions of transistor elements, as also discussed above. In other embodiments, the semiconductor layer may have any other desired composition and layer thickness. Furthermore, in some illustrative embodiments, a buried insulating layer 202, for instance, including silicon dioxide, silicon nitride, silicon oxynitride, or any other appropriate dielectric material or materials, may be provided at least in some areas of the semiconductor device 200, thereby establishing an SOI (silicon- or semiconductor-on-insulator) configuration in combination with the overlying semiconductor layer 203.

It should be appreciated that application of the concepts of the present disclosure to sophisticated planar transistors formed on the basis of an extremely thin initial semiconductor material may be highly advantageous in supporting further scalability of existing sophisticated semiconductor devices. The concepts disclosed herein, however, may, in other illustrative embodiments, be also applied to bulk transistor configurations based on planar architecture with and/or without fully depleted device configurations.

Furthermore, the semiconductor layer 203 may be covered by an optional thin liner 204, such as a silicon dioxide material and the like, followed by further material layers, such as layers 205 and 206, which may be formed of silicon dioxide, silicon oxynitride, silicon dioxide and the like. For example, the layer 205 may be provided in the form of a silicon nitride material and the layer 206 may be formed of silicon dioxide material. Furthermore, a sacrificial material layer 207, which may be used for forming mask features, may be provided above the layer 206 and may include any appropriate material, such as polycrystalline silicon, amorphous silicon and the like. The sacrificial material layer 207 may exhibit a specific etch selectivity with respect to the underlying layer 206. Generally, the material layers formed above the semiconductor layer 203 may be provided in any appropriate combination so as to provide the respective protective effect and etch selectivity as may be required during the further processing, wherein many such material compositions and combinations are well established in the art.

Thereafter, a stack of layers may be provided so as to enable the application of a sophisticated lithography process. For example, a respective planarization layer 208A, for instance, including a polymer material and the like, may be spin-coated on the underlying material layer based on well-established approaches. Furthermore, layers 208B and 208C, such as a silicon dioxide material, silicon oxynitride material, amorphous carbon and the like, may be provided, followed by a bottom anti-reflective coating (ARC) layer 208C. Moreover, a pattern of resist features 209A may be formed so as to correspond to a desired spatial pattern of mask features still to be formed from the layer 207. On the other hand, the respective pattern of resist features may be specifically designed in the second device region 200B so as to correspond to the specific spatial requirements of transistor elements to be formed therein in a later manufacturing stage. For convenience, these resist features are indicated as 209B.

The semiconductor device 200 as illustrated in FIG. 2A may be formed on the basis of well-established process strategies in which the semiconductor layer and the corresponding modified portions 203P, such as Si/Ge as discussed above, may be provided in accordance with well-established strategies, for instance, by removal processes, selective epitaxial growth techniques and the like. Thereafter, the layers 203, 204 and 205 may be formed by well-established deposition techniques, wherein any appropriate materials, such as silicon dioxide, amorphous carbon, silicon nitride and the like, may be used in combination with well-established deposition techniques. Thereafter, the sacrificial material layer 207 may be deposited, for instance, on the basis of chemical vapor deposition (CVD) techniques for forming silicon material in polycrystalline or amorphous state. Next, the layers 208A, 208B, 208C may be provided while using well-established process strategies. Subsequently, a lithography process may be applied, for instance, in some illustrative embodiments as, depending upon the required pitch for the resist features 209A, 209B, immersion-based lithography techniques, for instance, on the basis of a "light" source in the form of an ArF laser. In other illustrative embodiments, a less sophisticated lithography technique may suffice, for instance, without using an immersion liquid, when the respective initial pitch is well within the capabilities of a corresponding non-immersion process.

Consequently, the resist features 209A, 209B may be formed upon exposing and developing the previously applied resist layer and may then be used for a subsequent etch process for transferring the resist features 209A, 209B into the lower lying material layers, i.e., first transferring the features into the hard mask material 208B, etching through the layer 208A, and etching the sacrificial layer 207.

Figure 2B:
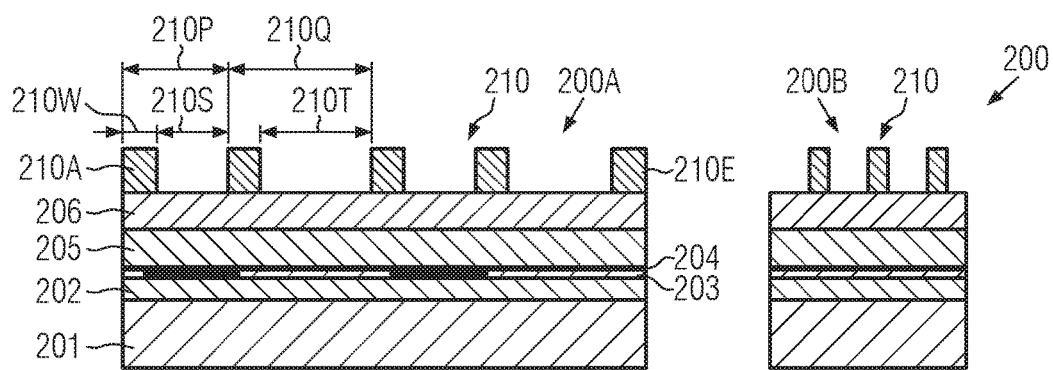

FIG. 2B schematically illustrates the semiconductor device 200 after completing the above-described process sequence. That is, the semiconductor device may include a first plurality of first mask features 210 in the first device region 200A, which may include a plurality of mask features 210A-210E having width dimensions and spacings in accordance with device requirements. For example, in the embodiment shown, the various mask features 210A-210E may be formed with substantially the same design value for the respective width 210W, as, for instance, discussed above with reference to FIG. 1A when referring to the mask features 110. Similarly, two different values for lateral spaces 210S, 210T may be established, for instance, having dimensions as also discussed above in the context of FIG. 1A. Consequently, the width dimension, such as 210W, as well as the respective spaces 210S, 210T and, thus, respective pitches 210P, 210Q of the first mask features 210A-210E may be obtained on the basis of a single lithography process applied for forming the mask features 209A of FIG. 2A.

On the other hand, in the second device region 200B, the first mask features 210 may be formed in accordance with a width and spacing as required for forming transistor elements in this device region.

It should be noted that, in particular, the patterning of the sacrificial layer 207 may be accomplished on the basis of well-established anisotropic etch recipes, wherein the underlying layer 206 may be efficiently used as an etch stop material.

Figure 2C:
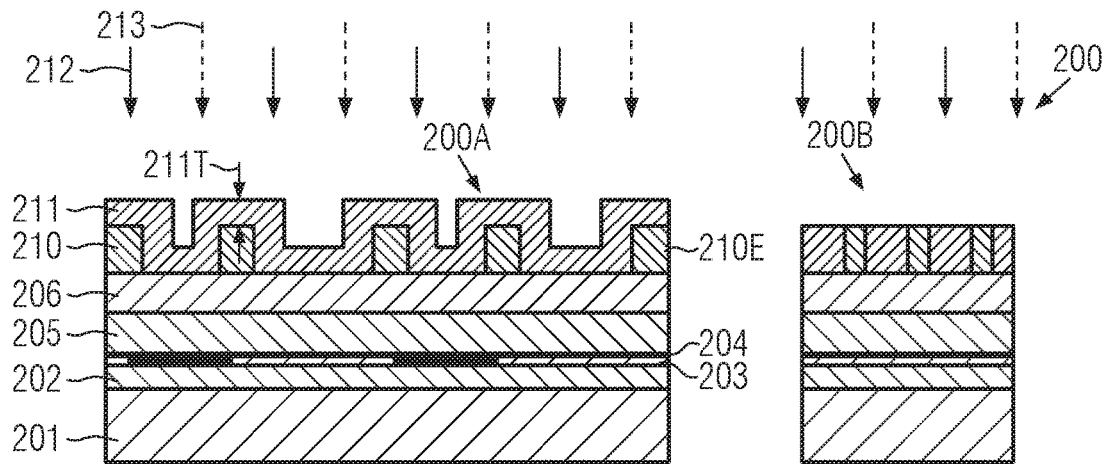

FIG. 2C schematically illustrates the semiconductor device 200 in a further advanced manufacturing stage in which a process sequence may be applied so as to obtain second mask features on the basis of the first mask features 210. To this end, a well-controllable deposition process 212 may be applied so as to form a mask layer 211, which may be formed of any appropriate material that may exhibit a substantial etch selectivity with respect to the first mask features 210. For example, the layer 211 may be provided in the form of a silicon nitride material, for which highly controllable deposition techniques are available in the art, so that a layer thickness 211T may be precisely controlled, thereby enabling the formation of a highly conformal layer covering the surface topography created by the first mask features 210.

In particular, the layer thickness 211T is selected so as to obtain a desired base width of further mask features still to be formed. For example, the highly conformal deposition of a plurality of materials, such as silicon nitride, silicon dioxide, metal-containing materials, on the basis of CVD techniques, ALD techniques, and the like, are available and enable any desired selection of the layer thickness 211T. Consequently, the initial width and spacing of the first mask features 210 in combination with the layer thickness 211T may define, in a self-aligned manner, the base width of further mask features still to be formed. Thereafter, a respective etch sequence 213 may be applied and may exhibit a highly directional removal behavior, thereby etching the layer 211 with high fidelity, i.e., substantially without reducing the thickness of vertical layer portions, while efficiently removing horizontal layer portions, thereby forming respective spacer elements. It should be appreciated that respective highly directional etch techniques may be readily available in the form of well-known process strategies, while appropriate process parameters may be readily determined on the basis of experiments and the like. It should be noted that, in addition to the layer 211, an optional etch stop liner, for instance, including silicon dioxide and the like, may be formed prior to the deposition of the layer 211. In this case, the thickness of the optional liner (not shown) may have to be taken into account when selecting an appropriate layer thickness 211T for the layer 211.

Figure 2D:
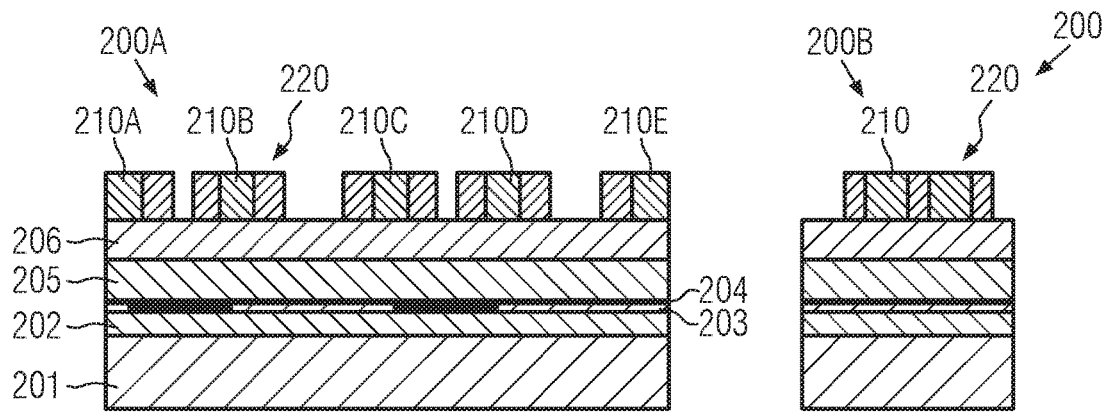

FIG. 2D schematically illustrates the semiconductor device 200 after completing the above-described process sequence. That is, after completing the etch process 213 (see FIG. 2C), second mask features 220 in the form of sidewall spacers of the first mask features 210A-210E in the first device region 200A may be provided. Similarly, in the second device region 200B, the first mask features 210 may have received "sidewall spacers" in the form of the second mask features 220.

Figure 2E:
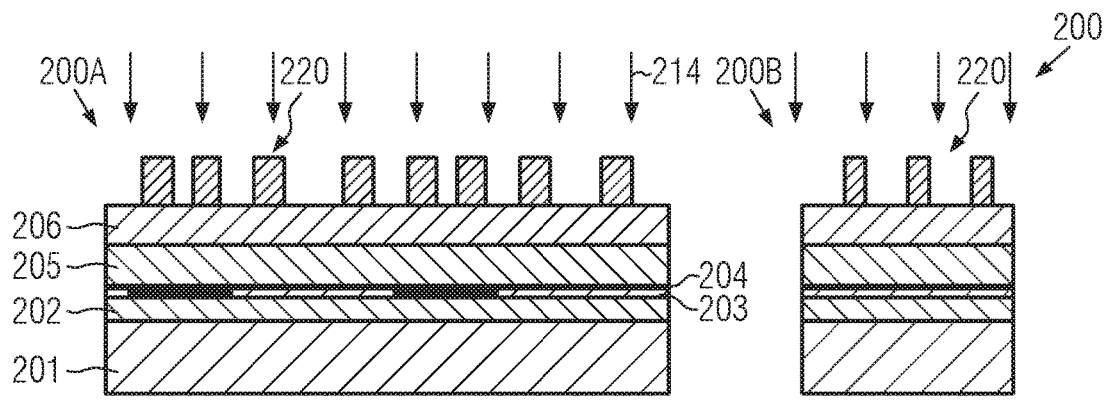

FIG. 2E schematically illustrates the semiconductor device 200 when exposed to a further etch ambient 214 in which the first mask features 210 (see FIG. 2D) may be removed selectively to the second mask features 220. To this end, a plurality of well-established etch chemistries are available, for instance, based on hot ammonia and the like. The manufacturing stage as shown in FIG. 2E obtained after removal of the first mask features 210 (see FIG. 2D) may correspond substantially to the stage as shown in FIG. 1A in which the second mask features 120 are illustrated. Also in this case, it is evident that the number of second mask features 220 is greater, typically by a factor of 2, compared to the number of the mask features 210, since the features 220 basically represent respective sidewall spacer elements.

Figure 2F:
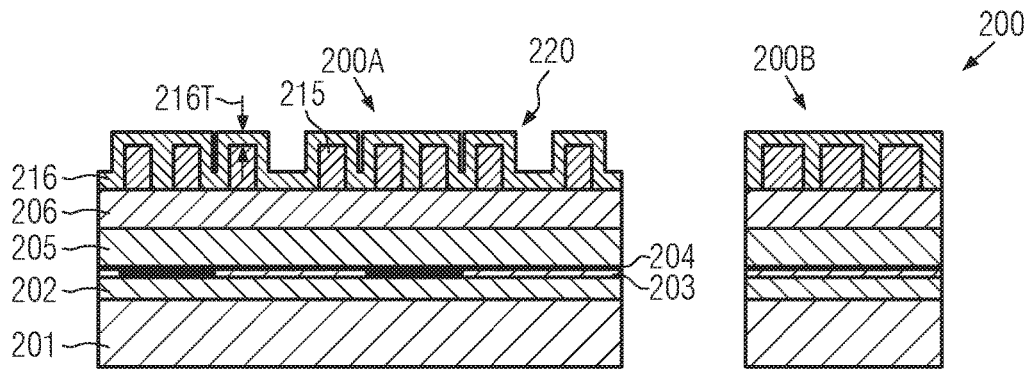

FIG. 2F schematically illustrates the semiconductor device 200 after a further deposition process for forming a further mask or spacer layer 216, for instance, including any appropriate mask material, such as silicon nitride, silicon oxynitride and the like. Furthermore, an etch stop liner 215, for instance, including silicon dioxide, may be formed prior to the deposition of the layer 216. Similarly, as discussed above in the context of the layer 211 (see FIG. 2C), a layer thickness 216T may be selected so as to provide for a desired design width of at least some of the second mask features 220. For example, the reduced layer thickness may be selected thinner compared to the layer 211 when a relatively moderate modification of the width of some of the features 220 may be required. With respect to any conformal deposition techniques, the same criteria may apply as previously discussed in the context of the layer 211. Since not all of the features may have to be modified in the width dimension, the respective portions of the mask features 220 to be modified may have to be covered by an appropriate etch mask upon patterning the layer 216.

Figure 2G:
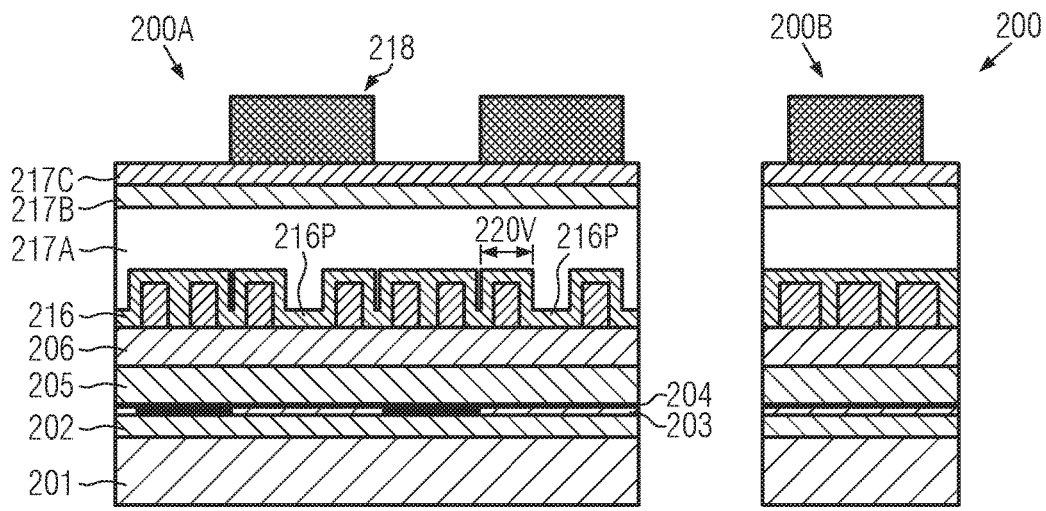

FIG. 2G schematically illustrates the semiconductor device 200 in a further advanced manufacturing stage in which a respective resist mask 218 may be provided so as to cover relevant portions of the semiconductor device 200 during a subsequent etch process for removing relevant portions of the spacer layer 216. To this end, an appropriate stack of layers, for instance, a planarization layer 217A, for instance, in the form of a polymer material, followed by a hard mask layer 217B, such as silicon oxynitride, in combination with an ARC layer 217C may be provided prior to depositing an appropriate resist layer (not shown), which may be patterned into the resist mask 218 on the basis of lithography techniques. It should be appreciated that the respective lithography process to be performed so as to provide the resist mask 218 may be considered as a non-critical lithography process, since this process may have no substantial influence on the finally obtained width dimensions and spaces of active regions still to be formed. That is, these dimensions are defined by the mask features 220 in combination with non-removed portions of the layer 216. In other words, the respective features of the resist mask 218 may have to be positioned and dimensioned so as to cover respective intermediate layer portions, indicated by 216P, wherein a respective spatial variation within a width dimension of a single mask feature 220, indicated by 220V, may not be critical for the further processing. Consequently, any overlay imperfections of the respective lithography process used for providing the resist mask 218 may have no substantial effect on the modified mask features 220 and, thus, on the finally obtained pattern of active regions.

Figure 2H:
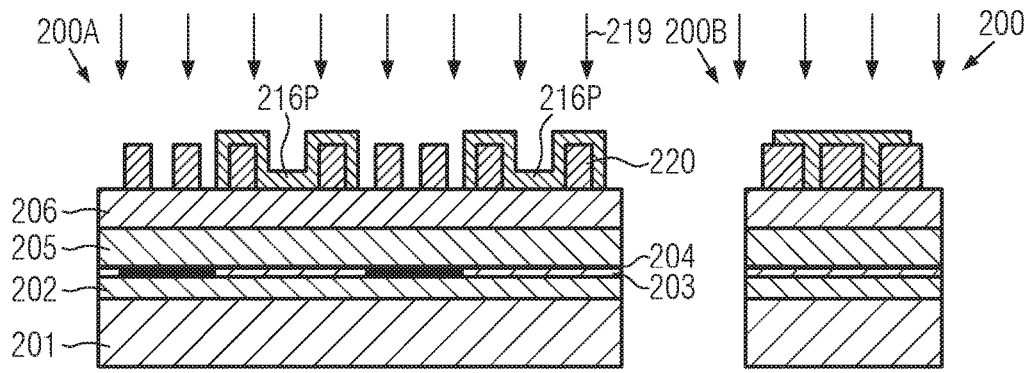

FIG. 2H schematically illustrates the semiconductor device 200 at a final phase of an etch process 219 performed on the basis of the resist mask 218 and the underlying material layers (see FIG. 2G). For convenience, any such respective mask features are not shown in FIG. 2H. As is evident, during the etch process or processes 219, the previously covered portions 216P of the mask layer 216 (see FIG. 2G) may be preserved, thereby providing additional sidewall spacers and, thus, modifying the width of the respective mask features 220 still covered by the layer portions 216P. It should be appreciated that the mask features 220 no longer covered by the layer 216 (see FIG. 2G) may be protected by the liner 216 at least during the final phase of the etch process 219.

Figure 2I:
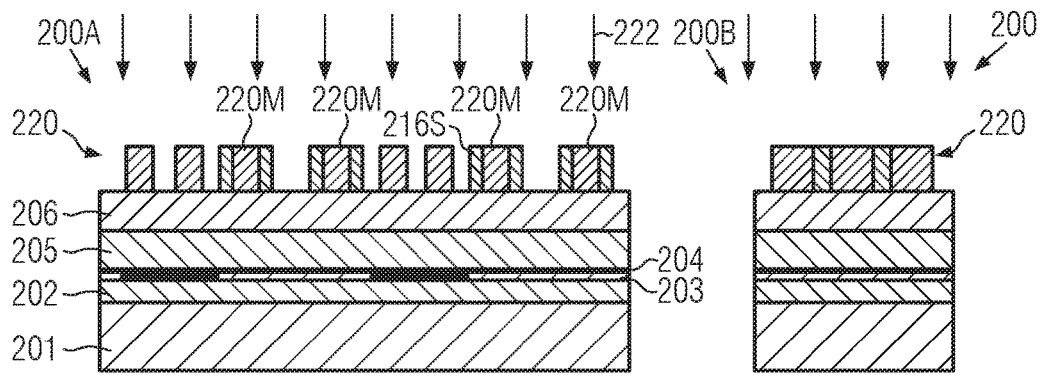

FIG. 2I schematically illustrates the semiconductor device 200 during a further etch process 222, or at least a certain phase of an etch sequence, during which horizontal portions of the layer portion 216P (see FIG. 2H) may be removed, thereby substantially preserving respective sidewall spacers 216S, which may, thus, result in a respective modified mask feature 220M, since the original width of the second mask features 220 may be modified by 2x the width or layer thickness of the layer 216 (see FIG. 2F) in the form of the respective sidewall spacers 216S.

Figure 2J:
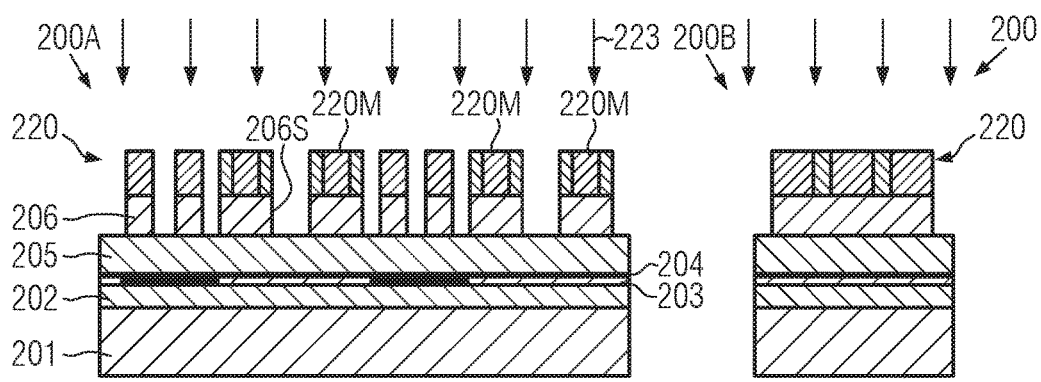

FIG. 2J schematically illustrates the semiconductor device 200 during a further etch process, or a further part of the overall etch sequence, indicated by 223, during which the layer 206 may be patterned on the basis of the mask features 220, including the modified portions 220M. The process or process sequence 223 may be performed on the basis of well-established etch recipes, wherein, in some illustrative embodiments, process parameters may be selected so as to provide an additional degree of freedom of adjusting the final lateral dimensions of active regions still to be formed. That is, by adjusting the sidewall angle of respective sidewalls 206S of trenches formed during the etch process 223, the respective width and spaces of the masking effect provided by the mask features 220 may be "modulated" to a certain degree, thereby improving overall process flexibility. For example, upon implementing a certain sidewall angle, the effective width of the mask features 220 may be varied, for instance, may be increased by forming the sidewalls 206S so as to result in a narrower trench with increasing depth, or may be reduced, for instance, by providing a certain degree of "over-etching," that is, neighboring sidewalls 206S may result in a broader trench with increasing depth. It should be appreciated that appropriate process parameters may be readily selected on the basis of experiments and the like in order to obtain a desired sidewall angle for the sidewalls 206S. Furthermore, it is to be noted that a corresponding tapering of the sidewalls 206S may be readily taken into account in view of the desired final width dimensions upon forming the mask features 220, for instance, by appropriately adapting the respective layer thickness values of one or both of the layers 211 (see FIG. 2C) and 216 (see FIG. 2F).

Figure 2K:
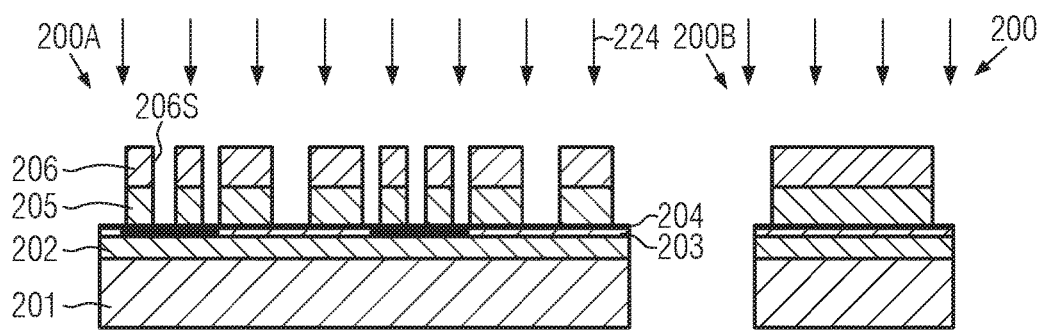

FIG. 2K schematically illustrates the semiconductor device 200 during a further etch process 224, which may represent a further process sequence of any of the previously performed etch processes. As illustrated, the etch chemistry may be selected so as to efficiently etch through the layer 205, which may be readily accomplished on the basis of well-established etch recipes, thereby using the patterned layer 206 as an efficient etch mask, while increasingly consuming the mask features 220 (see FIG. 2J). As discussed above, the tapering of the sidewalls 206S of the patterned layer 206 may, thus, translate into respective lateral dimensions of trenches formed in the layer 205.

Figure 2L:
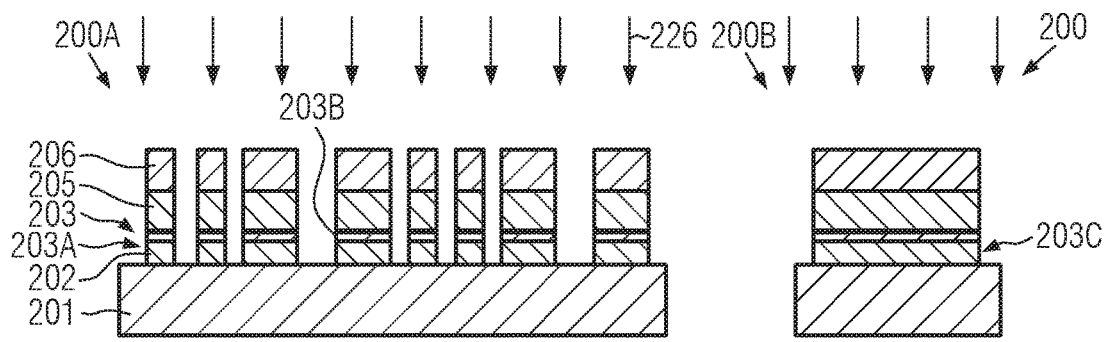

FIG. 2L schematically illustrates the semiconductor device 200 in a further advanced manufacturing stage, when a further etch process 226 or a further part of the previously performed etch sequence may be applied so as to etch through the semiconductor layer 203, thereby providing active regions 203A, 203B, 203C delineated with respect to the lateral width direction, thereby specifying a width dimension of respective planar transistor elements still to be formed on the basis of the active regions 203A, 203B, 203C.

As discussed, due to the different width dimensions and spaces of the modified second mask features 220 (see FIG. 2J), respective lateral dimensions and spaces for the active regions 203A, 203B, 203C may be obtained, wherein, as discussed above, the tapering of the sidewalls 206S (see FIG. 2J) may also be taken advantage of in tuning the final width dimensions. It should be appreciated that some of the active regions, such as the active regions 203A, may be formed on the basis of the portions 203P (see FIG. 2A), while others may be formed on the basis of a substantially non-modified semiconductor material 203, such as the active regions 203B. Moreover, the etch process 226 may be appropriately modified so as to etch through the buried insulating layer 202, if a buried layer is present.

Figure 2M:
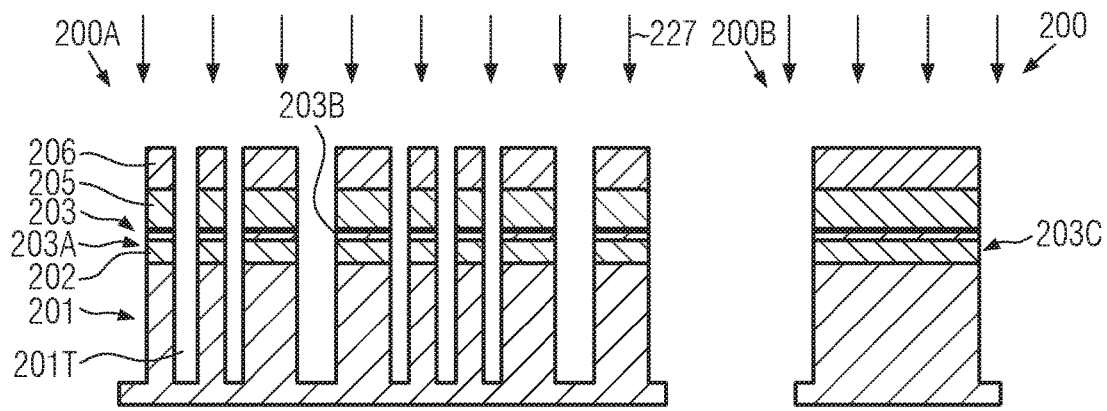

FIG. 2M schematically illustrates the semiconductor device 200 in a still further advanced manufacturing stage in which a further etch process 227 may be applied so as to form moderately deep isolation trenches 201T in the substrate material 201, if required for appropriately laterally isolating respective substrate regions, which may, in sophisticated applications, be provided as an additional conductive region for controlling transistor performance.

Consequently, the lateral patterning of the active regions 203A, 203B, 203C in the width direction may be accomplished on the basis of the above-described process sequence, thereby also forming the trenches 201T, if required, wherein, in view of the respective dimensions in the width direction, the same criteria may apply as previously discussed in the context of FIG. 1A. For example, the lateral dimensions of the active regions 203A, 203B may correspond to criteria as discussed above for the active regions 130A, 130B, 130C, 130D at the bottom portion of FIG. 1A. Hence, width dimensions and spaces and, thus, respective smallest pitches, may be obtained in a self-aligned manner for the active regions 203A, 203B on the basis of a single lithography process, followed by deposition and etch techniques in order to provide the respective spatial layout of the active regions 203A, 203B along the width direction.

Figures 2N, 2O:
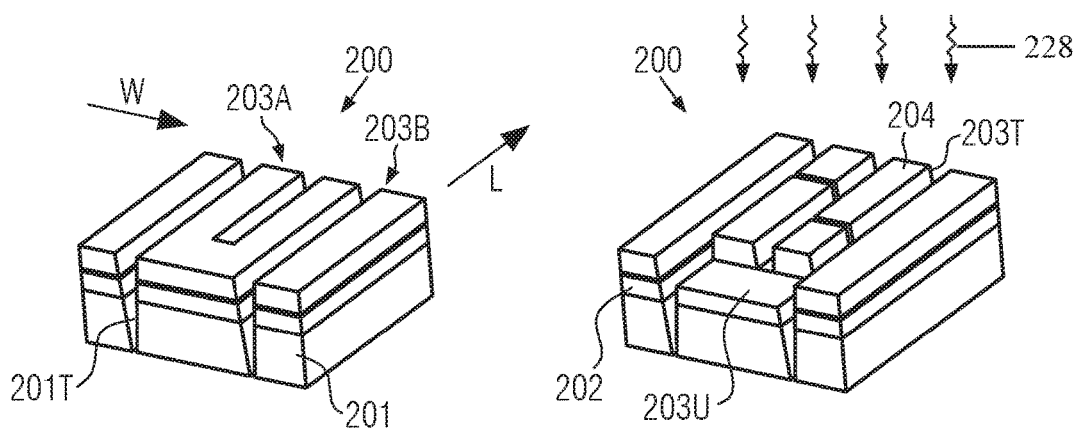
FIGS. 2N and 2O schematically illustrate a perspective view of the semiconductor device for delineating the active regions in a second orthogonal direction according to illustrative embodiments.

FIG. 2N schematically illustrates a prospective view of the semiconductor device 200 corresponding to a manufacturing stage as basically shown in FIG. 2M, that is, after completing the respective etch process 227 of FIG. 2M, thereby providing the active regions 203A, 203B separated along the width direction W, but still requiring a separation along an orthogonal direction, indicated as L.

To this end, sophisticated lithography techniques may be applied, for instance, on the basis of immersion lithography, using ArF light sources or any other appropriate techniques that allow for the desired alignment accuracy and reticle dimension.

FIG. 2O schematically illustrates the semiconductor device 200 in perspective view after having performed a respective sophisticated lithography process in combination with a respective etch regime, commonly indicated as 228, in order to form respective isolation trenches 203T, 203U cutting through the patterned layer 204 and through the respective underlying active regions 203A, 203B (see FIG. 2M). During the respective process sequence 228, the isolation trenches 203U may be formed in accordance with overall design criteria, for instance, these trenches may be formed so as to extend through the buried insulating layer 202, if required. On the other hand, the trenches 203T may at least extend through the respective active regions.

Consequently, the active regions of the semiconductor device 200 may be provided with lateral dimensions along the width direction and with respective spaces and, thus, pitches, that may be defined by a single lithography process, followed by deposition and etch sequences, thereby providing superior uniformity and increased process flexibility in obtaining critical dimensions in the width direction that allow the possibility of increasing packing density and/or reducing overall manufacturing costs.

Figure 3A:
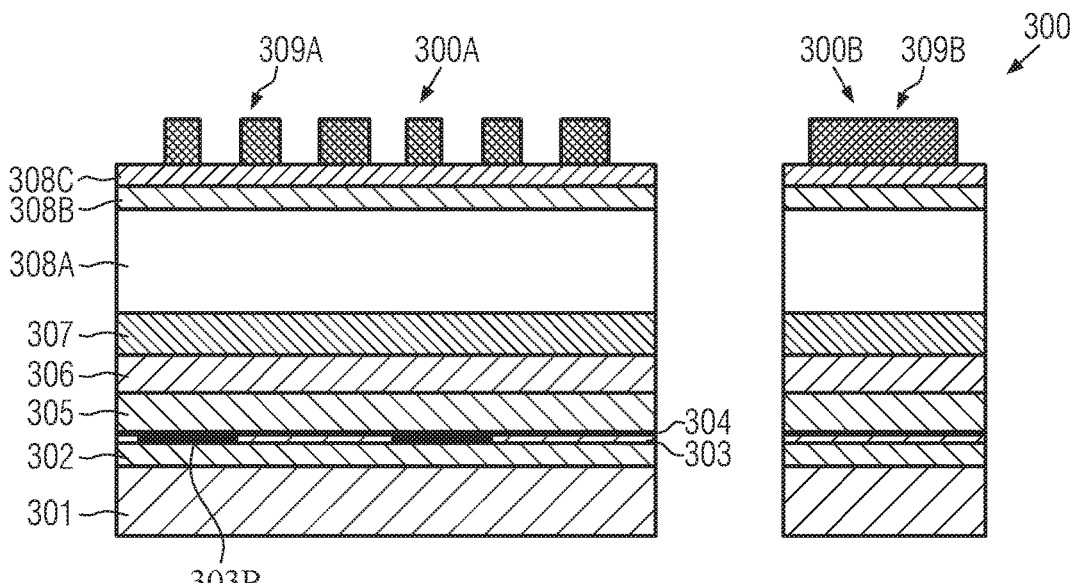

FIG. 3A schematically illustrates a cross-sectional view of a semiconductor device 300 in a relatively early manufacturing stage that substantially corresponds to the stage of the semiconductor device 200 shown in FIG. 2A. Furthermore, the semiconductor device 300 may be processed in accordance with a general process regime as also discussed above with reference to FIG. 1B.

In this manufacturing stage, the semiconductor device 300 may include a first device region 300A and a second device region 300B, above which may be formed resist patterns 309A, 309B, respectively. Furthermore, the semiconductor device 300 may include components 301, 302, 303, 304, 305, 306, 307, 308A, 308B, 308C, which may have substantially the same configuration as the respective components described in the context of the semiconductor device 200. It should be appreciated that similar or equivalent components of the semiconductor device 300 in comparison to the semiconductor device 200 are generally denoted by the same reference sign, except for the leading digit, which is a "3" instead of a "2." Consequently, the same criteria as previously discussed with respect to the semiconductor device 200 may also apply to any components described in the context of the semiconductor device 300.

As also discussed in the context of FIG. 1B, additional mask features may have to be formed so as to provide increased flexibility in initially setting width dimensions and space dimensions in the width direction by introducing one or more additional mask features compared to the concept discussed in the context of FIG. 1A. Consequently, the resist mask 309A may include additional mask features compared to the resist mask 209A in FIG. 2A so as to provide the additional flexibility. On the other hand, as discussed above in the context of FIG. 2A, the width and space dimensions of the resist features of the pattern 309A and also of the pattern 309B formed in the second device region 300B may be well within the capability of a respective lithography technique, as also discussed above.

Figure 3B:
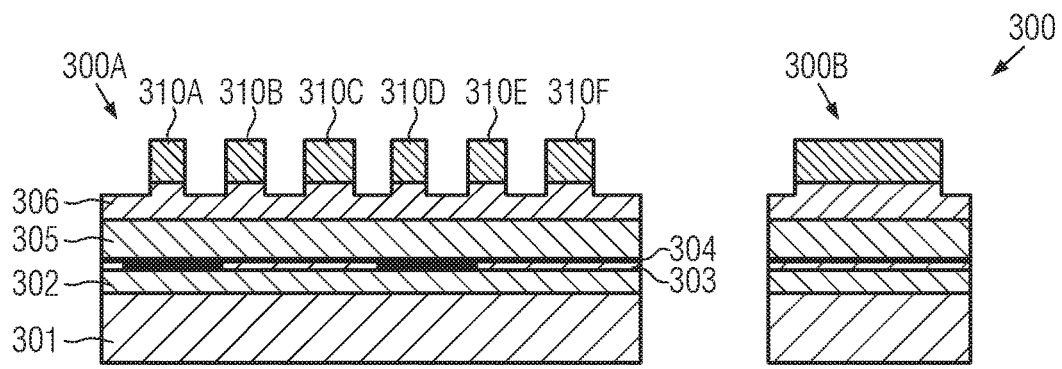

FIG. 3B schematically illustrates the semiconductor device 300 in a further advanced manufacturing stage, which may basically correspond to the manufacturing stage as schematically shown in the top portion of FIG. 1B. That is, based on the resist mask 309A, the underlying material layers may be patterned in accordance with any appropriate process technique as, for instance, discussed above in the context of the semiconductor device 200, thereby obtaining first mask features 310 having specific widths, dimensions and spaces between neighboring mask features in correspondence with the resist mask 309A of FIG. 3A. With respect to the width dimension and the respective spaces and, thus, pitches, of respective mask features 310A-310F, reference may also be made to FIG. 1B.

Figure 3C:
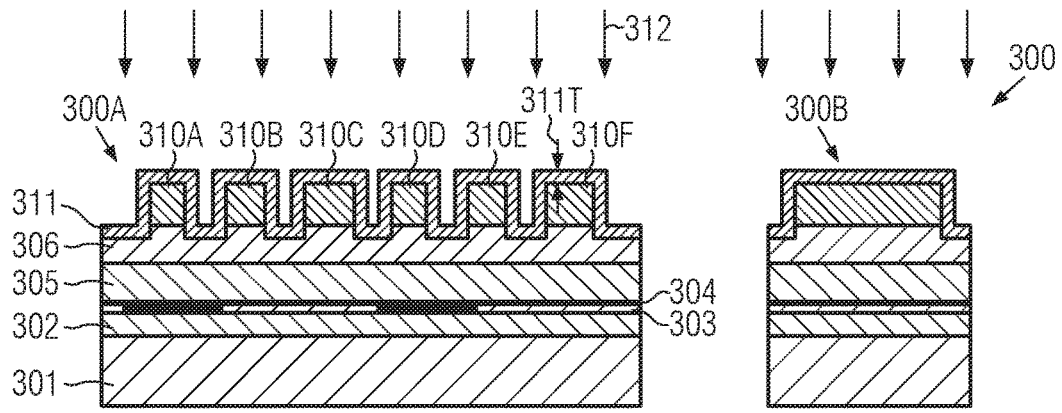

FIG. 3C schematically illustrates the device 300 after the deposition of a mask or spacer layer 311 with a thickness 311T in accordance with requirements for forming respective second mask features. With respect to material composition and deposition techniques of the layer 311, the same criteria may apply as previously discussed in the context of layer 211 of the device 200. That is, a deposition process 312 may be applied with appropriately selected process parameters in order to provide a high degree of conformality and for obtaining the desired layer thickness 311T.

Figure 3D:
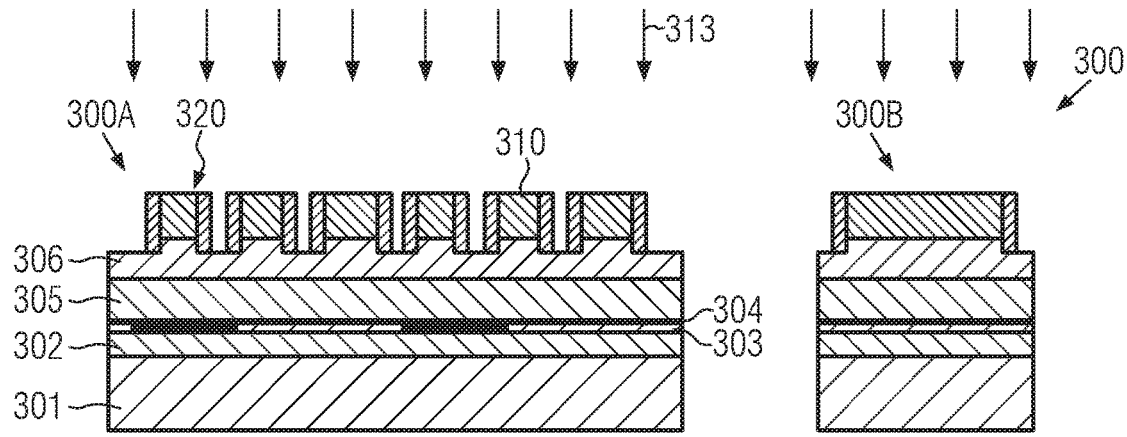

FIG. 3D schematically illustrates the device 300 when exposed to an etch process 313 that is designed so as to remove horizontal portions of the layer 311 (see FIG. 3C), thereby forming sidewall spacer elements as second mask features 320 positioned adjacent to the mask features 310. Also in this case, the same criteria may apply with respect to process parameters and the like as previously discussed in the context of the etch process 213 (see FIG. 2C).

Figure 3E:
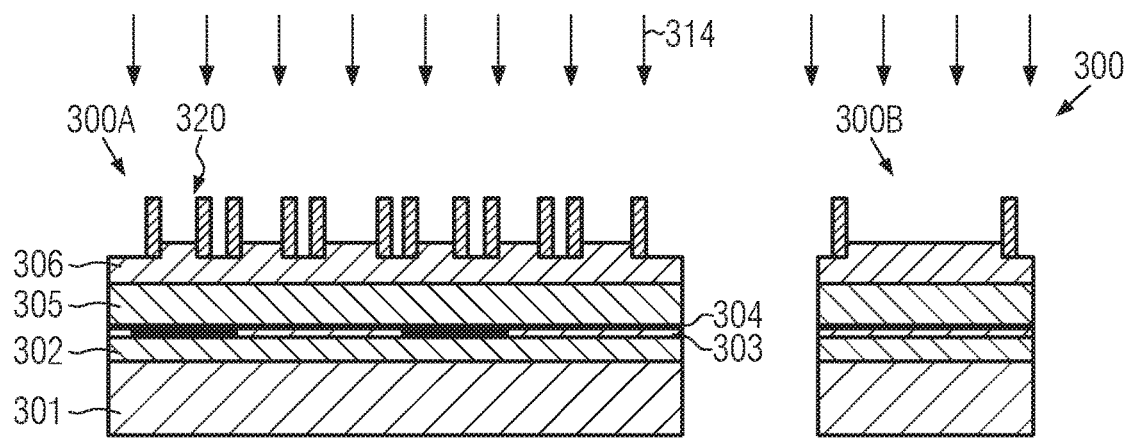

FIG. 3E schematically illustrates the semiconductor device 300 when exposed to a further etch ambient 314 that is appropriately established so as to selectively remove the mask features 310 (see FIG. 3D), thereby leaving the mask features 320, i.e., the respective sidewall elements, which may have substantially similar width dimensions due to the previously provided substantially conformal layer 311 (see FIG. 3C).

Figure 3F:
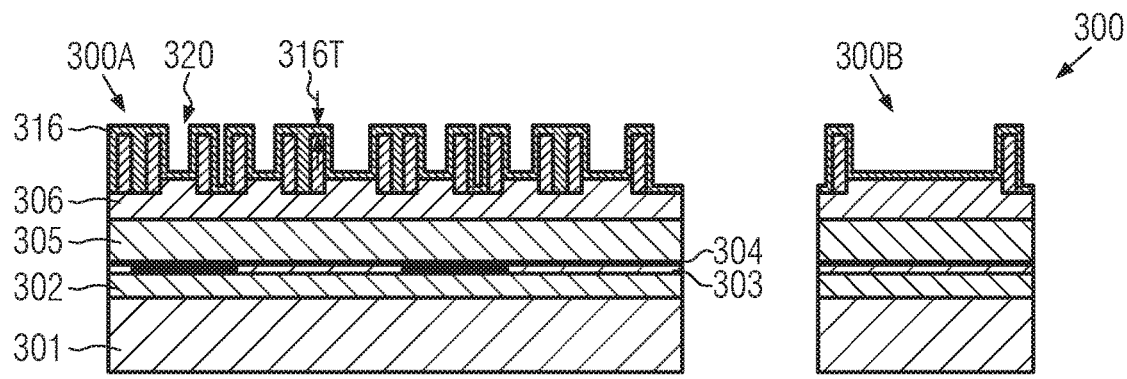

FIG. 3F schematically illustrates the semiconductor device 300 after a further deposition process for forming a further spacer or mask layer 316 having a well-defined thickness 316T. As also previously discussed, the layer thickness 316T may be selected in combination with the previous mask features 310 (see FIG. 3B) and the layer thickness 311T (see FIG. 3C) so as to obtain a minimum required spacing between neighboring mask features with well-defined width dimension. With respect to materials and deposition techniques for the layer 316, the same criteria may apply as previously discussed in the context of the layer 216 of the semiconductor device 200. That is, the thickness of the layers 311 and 316 may be selected in view of design requirements and may range from one to several tens of nanometers.

Figure 3G:
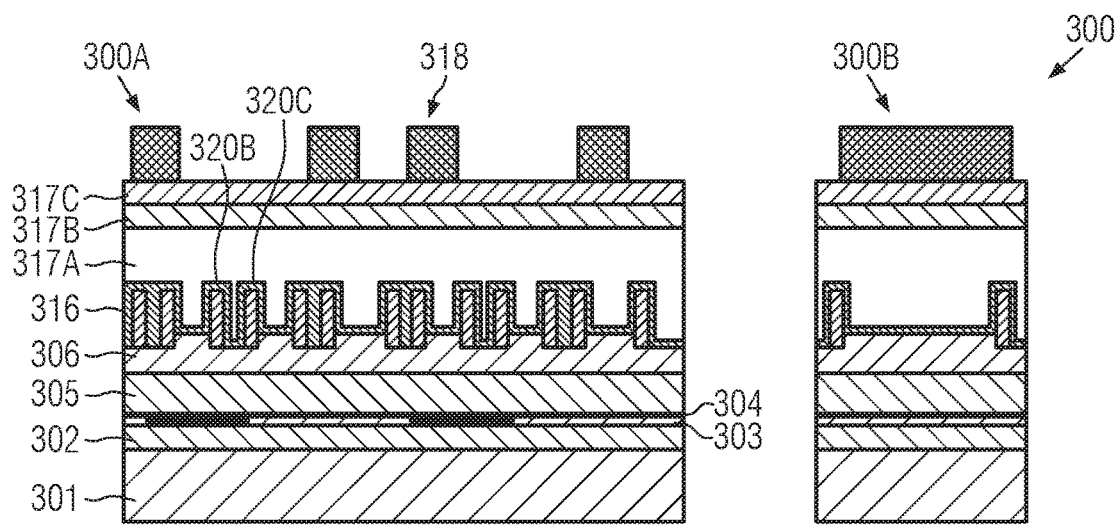

FIG. 3G schematically illustrates the semiconductor device 300 after having provided the layer 316 and after performing a lithography process based on material layers 317A, 317B, 317C so as to obtain a resist mask 318. The resist mask 318 may be provided on the basis of any appropriate lithography technique, wherein, as also discussed above, overlay accuracy in particular is less critical, since the individual mask features may merely have to expose respective mask features 320, such as mask features 320B, 320C having defined therebetween the minimum space, while for any other mask features 320, it is only to be ensured that the layer 316 may not be removed in between neighboring features 320. It should be appreciated that the layer 316 between neighboring mask features 320, which may have to represent a single mask feature during the subsequent processing, may not completely fill the space therebetween as, for instance, shown in FIG. 3G, so that, in this case, the resist mask 318 may provide the required increase or modification in width of the respective mask features 320.

Figure 3H:
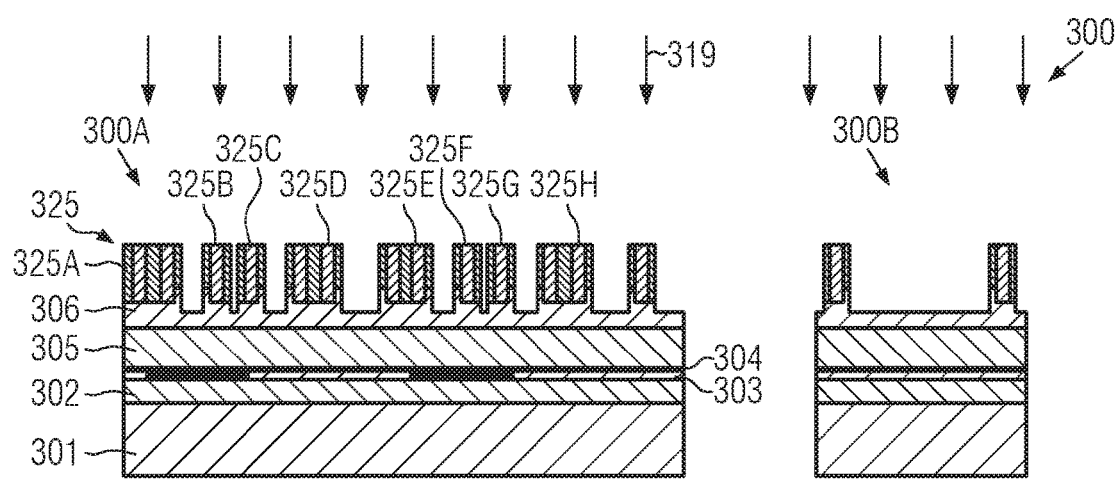

FIG. 3H schematically illustrates the semiconductor device 300 during a final phase of an etch process 319 performed on the basis of the resist mask 318 (see FIG. 3G) so as to remove the exposed horizontal portions of the layer 316 (see FIG. 3G). Consequently, and as discussed above in the context of the semiconductor device 200, respective modified mask features 325 may be provided based on the previously formed mask features 320 (see FIG. 3G). Again, the width dimensions and the respective spaces between neighboring mask features 325 may be defined by deposition and etch techniques on the basis of a single lithography process, while the additional lithography process applied for forming the resist mask 318 may have no substantial influence on the obtained mask features 325. Consequently, respective features 325A, 325B, 325C, 325D, 325E, 325F, 325G and 325H may be obtained with well-defined width dimensions, wherein a minimal width and minimal space may be provided between respective mask features 325B, 325C, thereby also defining a minimal or smallest pitch of these mask elements 325. For any details with respect to width dimensions and spaces, reference may also be made to FIG. 1B in the context of the mask features 125.

Figure 3I:
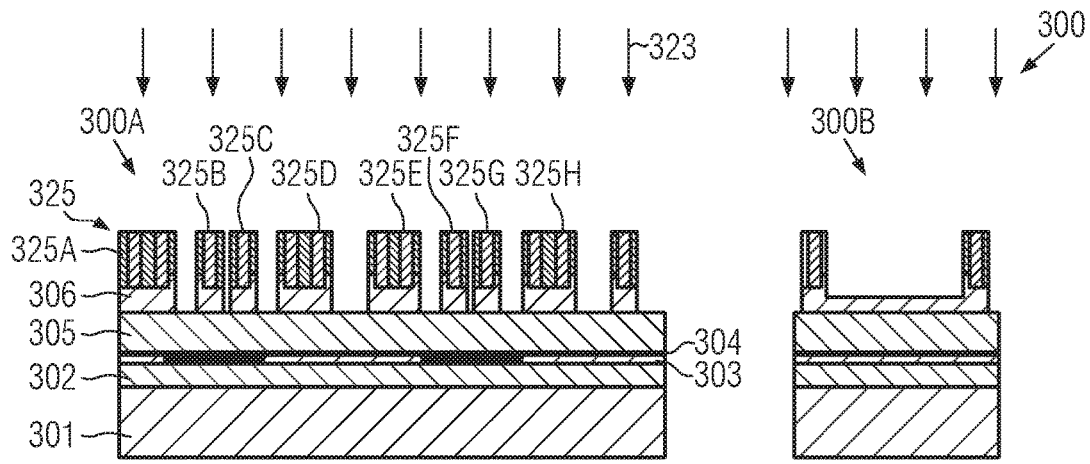

FIG. 3I schematically illustrates the semiconductor device 300 during an etch process 323, or a respective sequence, during which the layer 306 may be patterned on the basis of the previously formed modified mask features 325.

Figure 3J:
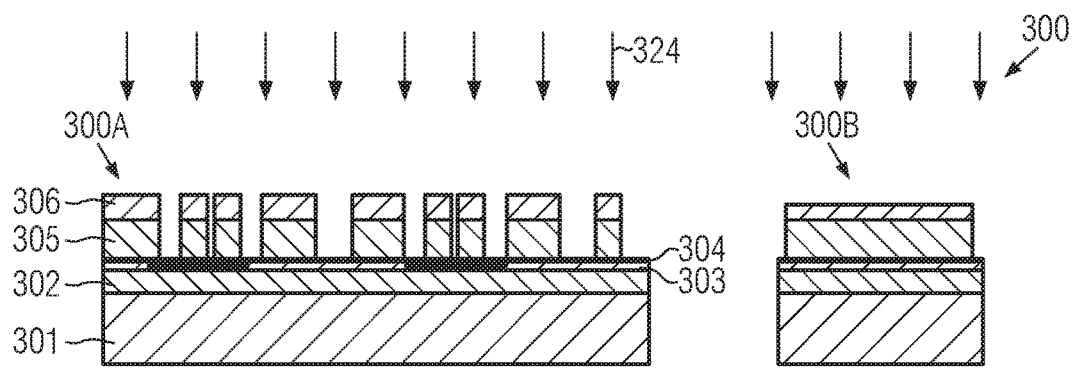

FIG. 3J schematically illustrates the semiconductor device 300 in a further advanced stage of the etch sequence or during a further etch process 324 for etching through the layer 305, while using the previously patterned layer 306 as an etch mask. Furthermore, in this process, the liner 304 may act as an efficient etch stop layer, if required.

Figure 3K:
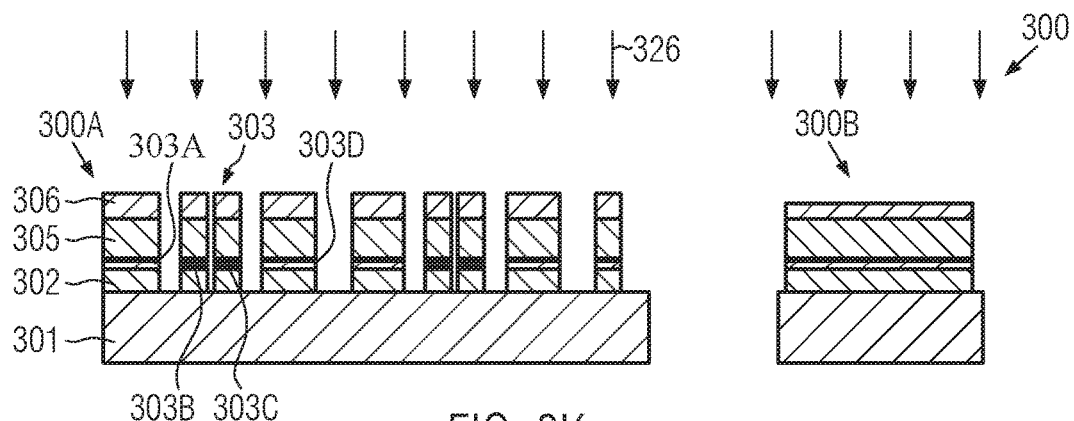

FIG. 3K schematically illustrates the semiconductor device 300 during a further part of the etch sequence or a separately adjusted etch process 326, during which the semiconductor layer 300 may be etched, thereby obtaining respective active regions or stripes thereof delineated with respect to the width direction. For example, active regions 303A, 303B, 303C, 303D may be obtained for a corresponding RAM cell having width dimensions and respective spaces, as also discussed and described in the context of FIG. 1B at the bottom portion thereof.

FIG. 3L schematically illustrates the semiconductor device 300 during a further part of the process sequence or a specifically designed etch process 327, in which the etch front may penetrate the substrate material 301, thereby forming respective moderately deep isolation trenches 301T.

With respect to the processes 323, 324, 326, 327, the same criteria may apply as previously discussed in the context of the corresponding etch sequence or processes applied to the semiconductor device 200. Moreover, if an SOI configuration may be provided, for instance, by incorporating the buried insulating layer 302, the etch process 326 may also etch through the layer 302, as shown in FIG. 3K.

After having formed the active regions 303A-303D with appropriate lateral dimensions in the width direction and with appropriate spaces and, thus, pitches, for instance, as discussed in the context of FIG. 1B, the further processing may be continued by delineating the active regions in the orthogonal direction as, for instance, discussed in the context of FIGS. 2N and 2O when referring to the semiconductor device 200. Hence, also in this case, appropriate lithography techniques may be applied in order to form respective isolation trenches.

In the embodiments discussed with reference to the semiconductor devices 200 and 300, the different device regions 200A, 200B and 300A, 300B may have experienced the same processes, so that, in these cases, any active regions to be formed in the second device regions 200B, 300B may be defined on the basis of the initial lithography process and the respective deposition and etch regime as discussed above.

With reference to FIGS. 4A-4L, further illustrative embodiments will now be described in more detail in which the patterning of active regions in the second device region may be performed with a certain degree of independence from the patterning of active regions in the first device region.

FIG. 4A schematically illustrates a cross-sectional view of a semiconductor device 400 including a substrate 401, a semiconductor layer 403, possibly in combination with a buried insulating layer 402, a liner 404, and mask or protective layers 405 and 406. It should be appreciated that components similar or identical to components described above in the context of the semiconductor devices 200 and 300 may be denoted by the same reference signs, except for the leading digit, which may be a "4" instead of a "2" or "3" for the devices 200 and 300, respectively. Consequently, any explanations with respect to material composition, manufacturing techniques and process strategy used for forming these components may be omitted. Furthermore, it should be appreciated that the device region 400B may represent the second device regions or any other device region in any of the process strategies discussed in the context of the semiconductor devices 200 and 300.

Moreover, contrary to the embodiments previously illustrated, the semiconductor device 400 may include an additional blocking layer 406B, which may include, for instance, silicon nitride, silicon oxynitride and the like. The blocking layer 406B may be formed prior to the deposition of any sacrificial material, such as the layers 207, 307 for the semiconductor devices 200, 300, respectively (see FIGS. 2A, 3A). Consequently, after performing the respective lithography process for defining lateral width dimensions and spaces of first mask features as, for instance, shown in FIGS. 2A, 2B for the device 200 and FIGS. 3A, 3B for the device 300, the blocking layer 406B may reliably protect the underlying material layer 406 when removing a sacrificial material 407 corresponding to the layers 207, 307 as discussed above. Consequently, FIG. 4A may represent a manufacturing stage in which mask features formed of the sacrificial layer 407 may be present in other device regions, while the layer portion in the device region 400B may have been completely removed, thereby exposing the blocking layer 406B.

FIG. 4B schematically illustrates the device 400 during a deposition process 412 for forming a mask or spacer layer 411, used for forming sidewall spacer elements in other device regions still having respective sacrificial mask features. Consequently, the status of the semiconductor device 400 may correspond to the device 200 as shown in FIG. 2C and the device 300 as shown in FIG. 3C.

Next, the layer 411 may be patterned so as to remove the layer 411 on horizontal device portions, while forming sidewall spacer elements in other regions. This corresponds to the manufacturing stage in FIGS. 2C, 2D for the device 200 and the phase of the device 300 as shown in FIG. 3D.

FIG. 4D schematically illustrates the device 400 when exposed to an etch ambient 414 applied for removing sacrificial mask features, for instance, as illustrated in FIGS. 2E and 3E for the semiconductor devices 200, 300, respectively.

FIG. 4E schematically illustrates the semiconductor device 400 after the deposition of a further spacer or mask layer 416, possibly in combination with an etch stop liner 415. This may correspond to the manufacturing stage as shown in FIGS. 2F and 3F of the semiconductor devices 200, 300, respectively.

FIG. 4F schematically illustrates the device 400 with a lithography mask 418, which may be provided together with respective lithography masks for modifying previously formed mask features in other device regions. For example, the mask 418 may be formed together with the mask 218 of the semiconductor device 200 as shown in FIG. 2G or the mask 318 of the semiconductor device 300 as shown in FIG. 3G. Consequently, the lithography mask 418 may be formed so as to define width dimensions and spaces of active regions to be formed in the semiconductor region 400B, thereby providing additional flexibility, since respective active regions and, thus, transistor elements, may be formed independently of the width dimensions and spaces of active regions in other device regions.

FIG. 4G schematically illustrates the semiconductor device 400 during a final phase of an etch sequence 419 for patterning underlying material layers on the basis of the lithography mask 418 (see FIG. 4E). Consequently, the layers 416 and the blocking layer 406B may be patterned in accordance with the lithography mask 418 (see FIG. 4E), thereby forming respective mask features for patterning active regions.

FIG. 4H schematically illustrates the semiconductor device 400 after having completed the above-described process sequence, thereby obtaining respective mask features 420. Thereafter, the process may be continued by applying a further etch process 422, for instance, corresponding to the process 222 as described in FIG. 2I.

FIG. 4I illustrates the semiconductor device 400 when exposed to a further etch ambient 423 for etching through the layer 406 on the basis of the mask features 420. This manufacturing stage corresponds to the stage as shown in FIG. 2J for the device 200 and to the stage of the device 300 as shown in FIG. 3I.

FIGS. 4J, 4K, 4L schematically illustrate the semiconductor device 400 during further stages of the patterning process for specifically designed etch processes, such as 424, 426, 427 (FIGS. 4J, 4K, 4L). Consequently, respective active regions 403U, 403V may be provided, as shown in FIG. 4K based on the mask features 420 (see FIG. 4H). Moreover, as shown in FIG. 4L, the patterning process may be continued in order to form respective isolation trenches 401T extending into the substrate material 401 with a desired depth.

Consequently, the process sequence as described in the context of the semiconductor device 400 may be appropriately combined with any of the process sequences described in the context of the semiconductor devices 200 and 300 and, in particular, for the respective first device regions 200A, 300A, thereby providing the possibility of independently defining width dimensions and spaces along the width direction of respective active regions.

FIG. 5 schematically illustrates a cross-sectional view of a semiconductor device 500, wherein the cross-section may be taken along a line V of FIG. 1A, i.e., the cross-section may be taken along a corresponding active region 130A, which may correspond to a portion for a transistor requiring increased current-carrying capacity in a RAM cell, such as a pass gate transistor or a pull-down transistor and the like. It should be appreciated, however, that the basic transistor configuration may be the same in any respective active region, irrespective of whether the transistor elements are intended for logic circuitry, analog circuit portions, memory circuit portions and the like that may have to be provided.

The semiconductor device 500 may, thus, include a transistor element 550 including an active region 503A, for instance, formed in accordance with criteria as previously discussed, and based on an appropriate semiconductor material, such as a crystalline silicon material, a crystalline silicon/germanium material and the like. Moreover, as also discussed above, in some illustrative embodiments, the active region 503A may have a thickness so as to enable a fully depleted configuration, at least in a central portion of a channel region 551. In other illustrative embodiments, the active region 503A may have any other required thickness, depending on overall device requirements. Furthermore, in the embodiment shown, an SOI configuration may be used when an appropriate buried insulating layer 502 may be positioned below the active region 503A. The active region 503A and, thus, a channel region 551 formed therein, may represent a planar geometry with a single current-carrying surface layer in the vicinity of a gate electrode structure 555, i.e., near or adjacent to a dielectric material 556 of the gate electrode structure 555. Furthermore, source and drain regions 552, 553 may be provided so as to connect to the active region 503A, which, in sophisticated applications, may be accomplished by providing a raised crystalline semiconductor material having implemented therein in situ doped species for providing a required high conductivity. In other cases, when the active region 503A may be formed with sufficient thickness, a raised drain and source configuration may not be required. Moreover, the active region 503A may be delineated by any appropriate isolation structure, indicated as 501T, which may be formed on the basis of isolation trenches, as previously discussed.

Generally, the transistor element 550 may be formed on the basis of well-established manufacturing techniques using the planar geometry of the active region 503A. That is, the active region 503A may be formed in accordance with strategies as discussed above, thereby defining a width dimension thereof, i.e., the dimension perpendicular to the drawing plane of FIG. 5, by a single lithography process and by deposition and etch techniques as discussed above. On the other hand, the separation along a length direction, i.e., in FIG. 5, the horizontal direction, may be accomplished by lithography techniques, as discussed in the context of FIGS. 2N and 2O with reference to the semiconductor device 200. Next, the isolation structure 501T may be filled with one or more appropriate materials, for instance, by deposition and planarization techniques.

Thereafter, the gate electrode structure 555 may be formed on the basis of sophisticated lithography techniques for patterning a previously formed layer stack, including appropriate dielectric material or materials and electrode materials, wherein, in sophisticated applications, a length of the gate electrode structure 555 may be 30 nm and even less. It should be noted, however, that the concept of a planar transistor architecture in combination with an active region patterned in accordance with the principles disclosed herein may also be applied to any other transistor generation. After forming the gate electrode structure 555, the drain and source regions 553, 552 may be formed, for instance, by epitaxial growth techniques and the like.

As a result, active regions for planar transistor elements may be patterned along a width direction on the basis of a single lithography process, followed by deposition and etch sequences in order to obtain the finally required width dimensions and spaces and, thus, a desired smallest pitch in a well-controllable self-aligned manner, thereby substantially reducing process-related variations and, thus, performance variabilities. That is, respective alignment imperfections associated with sophisticated lithography techniques may be replaced by highly controllable deposition and etch processes, which may typically exhibit significantly less variability. Consequently, increased packing density may be achieved, for instance, in some illustrative embodiments, in RAM areas, wherein a smallest pitch of approximately 50 nm and even less may be accomplished, while still enabling further scalability.

Therefore multiple width dimensions and multiple spaces or pitches with reduced process variability due to the avoidance of overlay errors typically associated with conventional approaches may be obtained when patterning the width dimensions and spaces of active regions on the basis of a sequence of sophisticated lithography processes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a first plurality of first mask features from a sacrificial material layer formed above a semiconductor layer of a semiconductor device, said first plurality of first mask features having one or more first lateral spacings of a first value along a width direction, said one or more first lateral spacings being defined by a lithography process;
   forming a second plurality of second mask features associated with said first plurality of first mask features by forming a mask material directly adjacent to said first plurality of first mask features, said second plurality of second mask features having one or more second lateral spacings of a second value, said second value being less than said first value;
   modifying at least one of said one or more second lateral spacings of said second plurality of second mask features by forming a spacer material directly adjacent to and between associated second mask features; and
   forming a plurality of active regions from said semiconductor layer by using said second plurality of second mask features including said modified at least one second lateral spacing, each of said plurality of active regions representing a semiconductor base layer for forming a planar field effect transistor.

2. The method of claim 1, wherein modifying said at least one of said one or more second lateral spacings of said second plurality of second mask features includes forming an etch mask above a portion of said second plurality of second mask features so as to cover a part of said spacer material and performing a further etch process in the presence of said etch mask so as to remove a non-covered part of said spacer material selectively to said second mask features not covered by said etch mask.

3. The method of claim 2, further comprising providing a first device region and a second device region and forming said first plurality of first mask features selectively in said first device region while blocking said second device region by a blocking layer formed below said sacrificial material layer.

4. The method of claim 3, further comprising forming mask features in said second device region concurrently with said second plurality of second mask features in said first device region by using said etch mask.

5. The method of claim 1, wherein said first value of said one or more first lateral spacings is a smallest value of spacing among said first mask features.

6. The method of claim 1, wherein forming said plurality of active regions includes etching through said semiconductor layer and a buried insulating layer formed below said semiconductor layer and into a substrate material by using said plurality of second mask features as an etch mask.

7. The method of claim 6, further comprising performing a lithography and etch sequence for providing a mask that defines respective length dimensions of said plurality of active regions and etching through said plurality of active regions in the presence of said mask to adjust a final length of each of said plurality of active regions.

8. The method of claim 1, wherein said lithography process is one of immersion lithography and non-immersion lithography based on an ArF light source.

9. The method of claim 1, wherein said one or more first lateral spacings include at least two lateral spacings of different values.

10. The method of claim 9, wherein each of said first plurality of first mask features is formed so as to have a substantially same width.

11. The method of claim 1, wherein said one or more first lateral spacings include at least three lateral spacings of different values.

12. The method of claim 11, wherein said first plurality of first mask features is formed so as to include a first portion of mask features having a first width and a second portion of mask features having a second width that differs from said first width.

13. The method of claim 1, wherein said plurality of active regions includes a group of active regions of a static RAM cell.

14. A method of forming active regions in a semiconductor device, the method comprising:
    forming a plurality of first mask features with width dimensions and respective lateral pitches obtained by a first lithography process;
    forming a plurality of second mask features from said plurality of first mask features by applying a sequence comprising at least one first deposition process, a subsequent etch process and at least one further deposition process;
    separating a plurality of active regions along a width direction by etching through a semiconductor layer using said plurality of second mask features as an etch mask; and
    separating said plurality of active regions along a length direction on the basis of a second lithography process.

15. The method of claim 14, wherein each of said plurality of first mask features is formed so as to have a substantially same width.

16. The method of claim 14, wherein said plurality of first mask features is formed so as to provide two or more different width dimensions.

17. The method of claim 14, further comprising forming a transistor element of planar architecture on at least some of said plurality of active regions.

* * * * *